United States Patent [19]

Garber

[11] Patent Number: 4,464,221
[45] Date of Patent: Aug. 7, 1984

[54] AUTOMATIC LAMINATOR

[75] Inventor: John L. Garber, Fenton, Mo.

[73] Assignee: Dynachem Corporation, Tustin, Calif.

[21] Appl. No.: 461,806

[22] Filed: Jan. 28, 1983

[51] Int. Cl.³ ............................................. B32B 31/20
[52] U.S. Cl. .................................. 156/484; 156/213;
156/227; 156/319; 156/52; 156/555; 156/572
[58] Field of Search ............... 156/521, 552, 556, 443,
156/475, 477.1, 482–484, 555, 226, 227,
200–202, 204, 212, 213, 572, 358, 359

[56] References Cited
U.S. PATENT DOCUMENTS

| | | | |
|---|---|---|---|
| 1,921,939 | 8/1933 | Parker et al. | 156/484 |
| 2,373,082 | 4/1945 | Staelin | 156/484 |
| 4,026,000 | 5/1977 | Anderson | 156/484 X |
| 4,080,727 | 3/1978 | Stolle et al. | 156/484 X |
| 4,080,732 | 3/1978 | Eberle | 156/484 X |
| 4,214,936 | 7/1980 | Del Biauco | 156/302 |
| 4,416,719 | 11/1983 | Horiochi | 156/555 |

*Primary Examiner*—David A. Simmons
*Attorney, Agent, or Firm*—Gerald K. White

[57] ABSTRACT

An apparatus for automatically laminating photoresist dry film onto each of a plurality of panels stacked upright in a panel feed unit with a 10° slant counterclockwise from the vertical, the film being characterized by being easily contaminated, limp and tacky although peelable thereby enabling the use of a polyethylene protective coating, includes a film feed bar for pulling the film from a roll into a laminating station on a 10° upward slant, the polyethylene coating being wound on a take-up roll, and further includes a film hold bar, a film hold cutoff bar and a film cutoff knife for cutting the film precisely to the length required for folding the film over the panel on both sides with no overlap. A panel pick-up unit picks up each of the panels in succession and moves it down into engagement with a transverse center line on the film, through a laminating nip and between heated laminating rolls, delivery belts and cooperating lugs moving the laminated panel to a delivery stack. The film feed, film hold, and film hold cutoff bars, and the panel pick-up unit include vacuum cups and/or cavities for handling the film and the panels. The sequential operation of the several components is controlled by a microprocessor.

20 Claims, 53 Drawing Figures

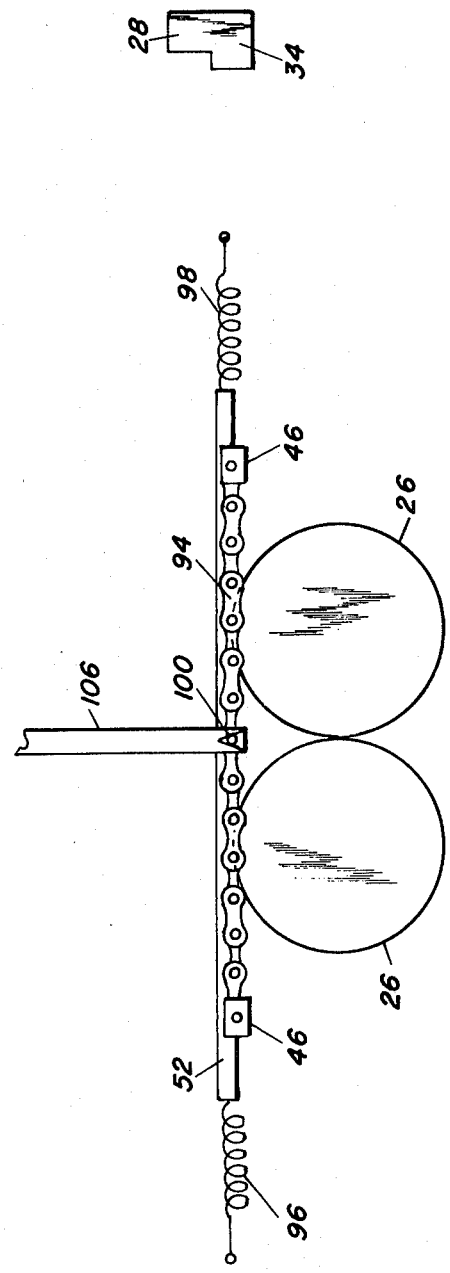
Fig. 10
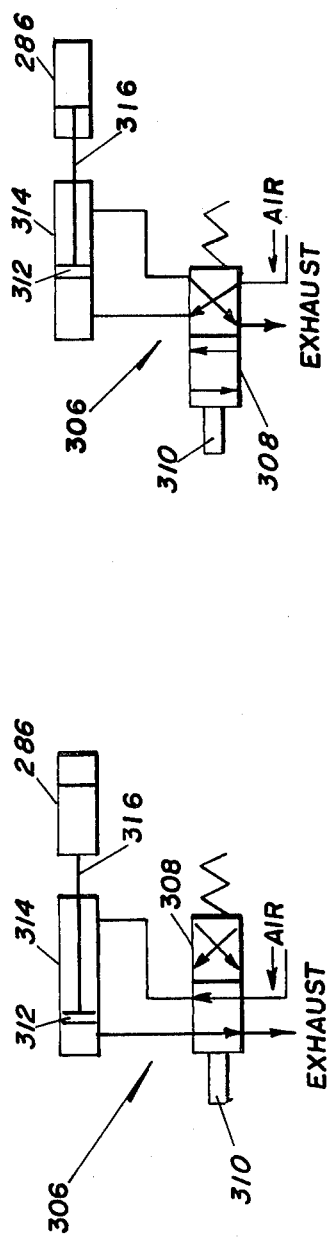
Fig. 49
Fig. 48

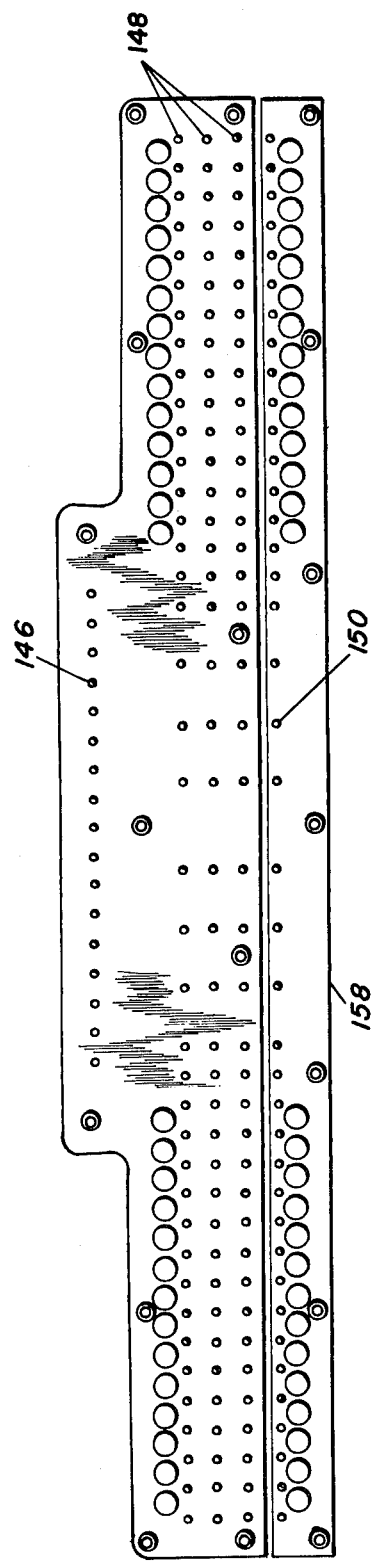

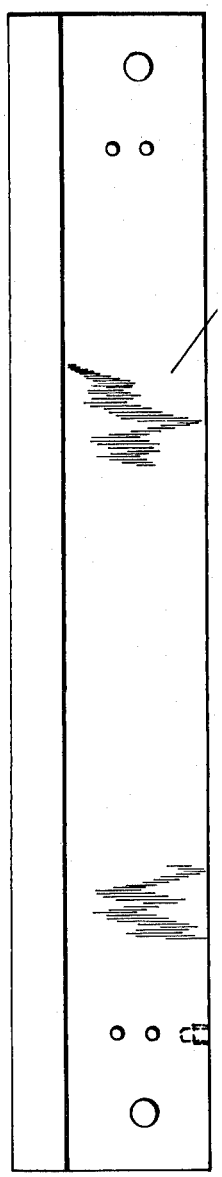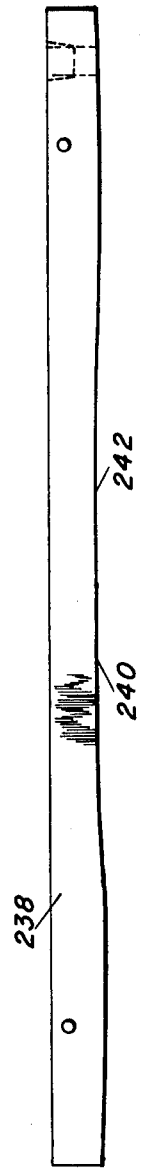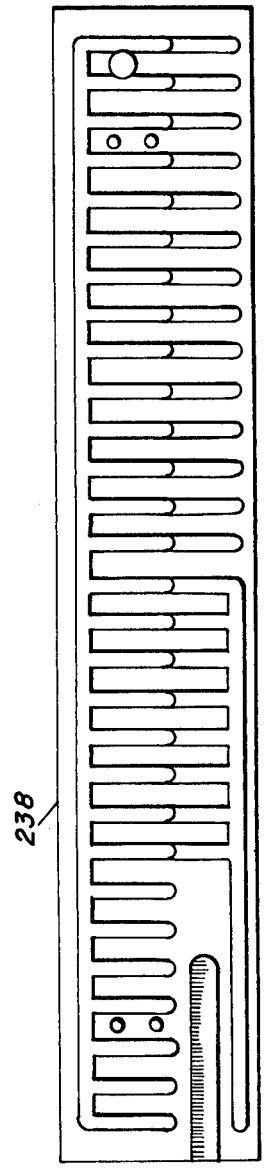

AUTOMATIC LAMINATOR

BACKGROUND OF THE INVENTION

1. Field of the Invention

The present invention relates to apparatus for laminating photoresist dry film onto circuit boards or panels that generally are made of copper and are used in the electronics industry, and more particularly, to a heated-roll laminator that is operative automatically simultaneously to laminate such film to both sides of each of a succession of stacked panels.

2. Description of the Prior Art

Photoresist dry films have been developed for use in the manufacture of printed circuit boards. Such boards have particular utility in the electronics industry. A particularly advantageous form of such film that is available commercially is the dry film photopolymer that is disclosed in U.S. Pat. No. 3,887,450, entitled "PHOTOPOLYMERIZABLE COMPOSITIONS CONTAINING POLYMERIC BINDING AGENTS". U.S. Pat. No. 3,887,450 was granted to Michael N. Gilano et al. and was assigned to Dynachem Corporation, 2631 Michelle Drive, Tustin, Calif. 92680. As manufactured, the film is characterized in being easily contaminated and also tacky and limp. Although tacky, the film is "peelable". This makes it possible to use a polyethylene cover film for protection and for facilitating handling. The composite is packaged in rolls. Typically, such photoresist dry films have thicknesses of 1.0, 1.5, 2.0 and 3.0 mils, and have widths in the range of 10 inches to 24 inches (25.4 cm. to 06.96 cm.).

Laminators for applying photoresist dry film to printed circuit boards have been proposed and used in the prior art. Prior art laminators, as manufactured and sold by Dynachem Corporation under its Model designations "120", "300", and "310", are manually operable laminators. Such laminators are useful in laminating one board or panel at a time. They require two supply rolls of photoresist dry film and two take-up rolls for disposing of the polyethylene cover film when a circuit board is to be laminated on both sides. Pull rolls are provided for pulling the photoresist dry film from each of the supply rolls over an associated side of the circuit board.

Aside from being manually operable and capable of laminating but one panel at a time, there has been a particular problem of undesirable film trim waste, particularly at the ends of the boards with such prior art laminators. This is because of an inherent difficulty in accurately positioning the leading ends of the films with respect to the leading end of the board as the films and the board are inserted between the pull rolls. As a consequence, it has been necessary to allow some excess or overlap of the films at the leading end of the board. Similarly, it has been difficult to accurately cut the films at the trailing end of the board, overlap again resulting. Thus, it has been necessary to trim both ends of the board.

Additional problems have been encountered in the use of the prior art laminators in applying photoresist dry films in wrinkle-free manner and uncontaminated condition to printed circuit boards. Such problems have stemmed from the presence of static electricity and film contaminating condensation resulting from smoke caused by the use of heated laminating rolls and heated devices used for cutting the film.

Machines for automatically assembling sheets of battery separator material over battery plates in envelope fashion and sealing the edges together have been proposed in the prior art. One such machine is disclosed in U.S. Pat. No. 4,080,727 granted to William H. Stolle et al. As described in the patent, "The material used for the separator envelope varies, but in general it must have some type of rib structure for holding most of its area away from the plate and it must be porous enough so that the acid and the ions can migrate in and out of the envelope from plate to plate."

In the patented machine, such ribbed separator material having a width greater than the battery plate to be enveloped is vertically fed by feeding rollers toward a folding station where it is cut by a shearing blade to a length of "about double" the height of the battery plate, a folding line also being scored across the material to facilitate bending thereof. A battery plate is conveyor fed against the fold line of the separator sheet, guides in the folding station causing the sheet to fold over and cover both upper and lower sides of the plate. Downstream, lifting devices lift the upper edge of the separator material on each side of the battery plate and hot melt adhesive is applied to the lower overlapping separator material edges. Rollers on each side of the conveyor press and seal the side edges of the envelope together. The sealed edges may then undergo a trimming operation. Assembled battery plates and envelopes are delivered from the downstream end of the conveyor onto a receiving platform from which they may be removed by hand or by a stacking storage device at the lower end of the platform which platform then is required to be downwardly inclined.

Other prior art patents that disclose machines for applying relatively stiff separators for producing enveloped battery plates are U.S. Pat. No. 2,373,082 granted to Carl G. Staelin and U.S. Pat. No. 4,026,000 granted to Kenneth A. Anderson.

In a preferred embodiment as disclosed in U.S. Pat. No. 2,373,082, pre-cut and creased mats of fibrous glass to be applied to the battery plates are arranged in a stack and fed between side edge guides, one by one, in horizontal position by grippers having sharp projections and by a linkage arrangement toward an applying station. Upon completion of movement in the feeding direction, the mat is only partially advanced to the applying station. When a succeeding mat is advanced, its leading edge abuts the trailing edge of the first mat between the side guides and pushes the latter to the applying station against a stop where the first mat is supported on a plate having a central slot located in alignment with the median and creased line of the mat. Here a battery plate delivered from a pasting machine is pushed vertically downward against the mat and through the slot in the plate so that the mat is folded over the opposite faces of the plate. Belts feed the plate downwardly pressing the mat in close contact therewith to cause the mat to be fixed securely to the plate. Upon emergence from the belts, the plates slide over a chute onto a conveyor. In a modified arrangement, the supply of mats is from a roll of fibrous glass web, the gripper having sharp projections feeding the web to the applying station in the same manner as the separate mats are fed in the preferred embodiment. At the applying station, the leading or advanced portion of the web is cut off to form a single mat.

U.S. Pat. No. 4,026,000 discloses apparatus for producing enveloped battery plates that is similar to the preferred embodiment disclosed in U.S. Pat. No. 2,373,082 in that a separator sheet dispenser is provided for dispensing individual separator sheets into an elongated passageway. The separator sheets, reaching a stopping point, buckle to form a fold at the approximate midpoint of the separator sheet. A battery plate dispenser feeds a battery plate against the fold line of the separator and compresses the sides of the separator against the opposite sides of the battery plate. Rollers feed the folded separator and battery plate through an ultrasonic sealing device for sealing the opposed edges of the separator to form an envelope around the battery plate.

U.S. Pat. No. 2,537,874 discloses a machine for producing display cards for jewelry and the like comprising a feeding rack for vertically feeding each of a succession of cards stacked in an upright position, adhesive applying rollers beneath the rack so that, as each cardboard passes downwardly, it receives adhesive material in strips on both sides thereof, and a horizontal sheet with an opening or slot therein underneath the rollers for supporting tissue paper. Each cardboard is adapted as it passes downwardly through the opening to engage the tissue paper and fold it against the side thereof, rollers being provided for pressing the tissue paper against the cardboard. The composite article is dropped into a container after which cards of appropriate size are cut by severing the article midway along the adhesive strips and transversely in accordance with the length desired for the display card.

U.S. Pat. No. 3,284,982 to John D. Conti discloses apparatus for banding cartons wherein the leading end of a carton being advanced by a pusher bar engages a downwardly extending portion at the leading end of a tape or ribbon of cellophane as supplied in between endless belts from a roll, jaws nipping the end of the tape and drawing it across the path of the oncoming carton. As the carton is moved over and above the tape, the leading end of the tape is pulled from the nipping jaws and heat sealed to the underside of the carton. As the carton is advanced, the tape is drawn up over the leading end and top side of the carton. The tape is then severed, allowing a length somewhat longer than enough to cover the trailing end of the carton, and the pusher bar advancing the carton is stopped. A vertically reciprocable tucker plate then tucks the tape around the trailing end of the carton and urges the severed end between the trailing end of the carton and a recessed portion of the adjacent pusher bar. The severed end of the tape is then said to be heat sealed to the underside of the carton.

While the foregoing prior art patents recognize some of the desirable attributes of laminators for making enveloped battery plates or display cards, there remain problems with adapting their teaching to an automatically operable laminator suitable for use in the efficient and effective lamination of easily contaminated and limp photoresist dry film to printed circuit boards or panels in a wrinkle-free and uncontaminated condition onto each of a succession of stacked printed circuit or other panels. Such problems include undesirable trim waste, mechanical difficulties in the handling of the panels which, when stacked upright in the manner of the prior art, tend to be unstable, mechanical problems in handling the film in wrinkle-free manner tending to result from the presence of static, and the contaminating effects on the film of condensation from smoke tending to result from the use of hot wire film cutting devices and from hot heated laminating rolls.

SUMMARY OF THE INVENTION

An object of the invention is to provide an automatic heated roll laminator that includes an improved calibration system that is operative accurately to cut the photoresist film to the precise printed circuit board or panel size prior to lamination thereby to eliminate the need for final trimming, and hence, film trim waste.

Another object of the invention is to provide such an improved laminator that is controlled by a microprocessor and includes a cathode ray tube (CRT) display presenting information relating to the operation of the machine.

A more specific object of the invention is to provide such an improved laminator including simple and effective film length adjustments to accommodate different size panels to be laminated.

A further specific object of the invention is to provide such an improved laminator wherein loading of the circuit boards or panels to be laminated is facilitated and the lamination operation is simple, the boards or panels being loaded and the laminator actuated with no additional operator help.

In accomplishing these and other objectives of the present invention there is provided an automatic laminator for laminating photopolymer resist dry film onto each of a succession of printed circuit boards or panels. In the operation of the laminator, the film is pulled into a folding or laminating station and pre-cut precisely to the desired length required for the circuit board to be laminated, with the polyethylene cover being wound on a take-up roll. A circuit board or panel is picked up from a stack located above the film, moved downwardly into engagement with the center of the film, being positioned transversely thereof, and is passed downwardly into a lamination nip and through heated laminating rolls whereby the film is laminated to both sides of the panel simultaneously. Temperature controlled infra red (IR) lamps heat the film during the laminating process.

More specifically, in the film feeding process and prior to the pulling of the film, a chain driven film feed vacuum bar disposed transversely of the film is moved toward the leading end thereof (toward the left in the apparatus embodiment herein illustrated in the drawings) to the cut-off knife position. At this position, vacuum cavities on the bar pick up the film at the leading edge thereof and pull the film in the reverse direction through the folding station a distance determined by the adjusted positions of film length adjustments that are provided. The bar is then stopped and the film is cut by the cutoff knife.

In accordance with the invention, the boards or panels in the stack or panel load-pile feed are slanted 10° counterclockwise from the vertical so that the panels will stay in place until picked up by the panel pick-up means. The film is disposed at a corresponding upward slant so that the panels will engage the film at substantially a 90° angle during their downward movement.

The panel pick-up comprises vacuum cups that are carried one at each end of a plurality of pneumatic cylinder driven bars that are actuated simultaneously to reach out toward the stack, pick up a panel, and move it directly above the center of the heated rolls.

A positive drive means moves the panel down into engagement with the center of the film, with the film to panel position being controlled, and down between the heated rolls, the temperature of which is accurately controlled. From the heated rolls, the laminated composite is moved down into a panel stacker.

Since the length of the film had been precisely cut to the desired length, the film is wrapped around both sides of the board with no overlap, thereby requiring no trimming.

The temperature of the heated rolls is accurately monitored by a microprocessor which also controls and directs the sequential operation of the various components of the laminator in feeding film, picking up each of the panels, in turn, pre-cutting a precise length of film for each panel, and moving each panel down into engagement with the pre-cut film and down through the heated rolls into the panel stacker. A CRT graphic display serves a useful purpose in providing highly visible dynamic information concerning the operation of the machine including panel count and the temperature at which the laminating rolls are being controlled, and also instructional information, for example, panel feeder empty, interlock open, automatic run status, etc.

BRIEF DESCRIPTION OF THE DRAWINGS

Having summarized the invention, a detailed description follows with reference being made to the accompanying drawings which form part of the specification, of which:

FIG. 10 is a schematic diagram illustrating a mechanism for controlling the film to panel position;

FIGS. 18-22 show the construction of the dry film hold cutoff bar;

FIGS. 31 and 32 are top plan and bottom views, respectively, of the panel attachment of FIG. 30, and FIG. 33 is a longitudinal edge view thereof;

FIGS. 48 and 49 schematically illustrate a solenoid actuated mechanism for operating two position vacuum valves of the vacuum system of FIGS. 43-47;

DESCRIPTION OF THE PREFERRED EMBODIMENT

Figure 1:
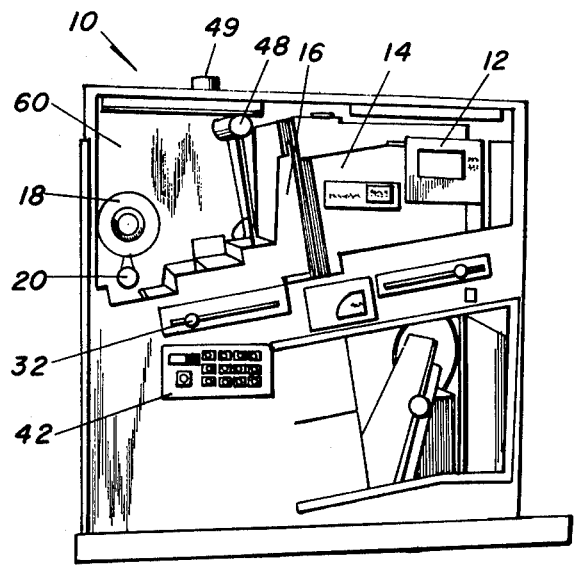
FIG. 1 is a front view of the automatic laminator according to the present invention.
Figure 2:
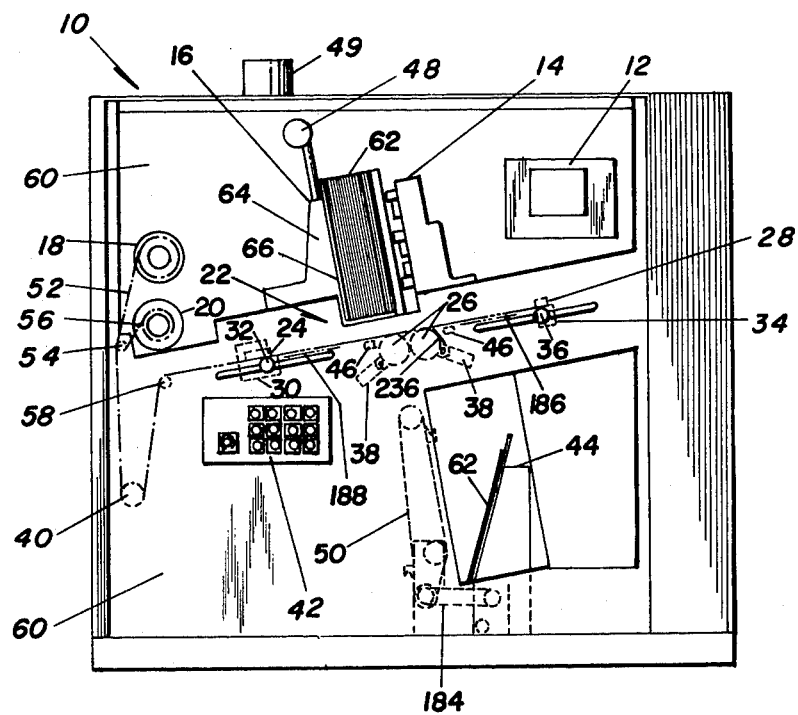
FIG. 2 is a schematic illustration of the automatic laminator of FIG. 1.

Referring now to FIGS. 1 and 2, an automatic laminator 10 according to the invention is completely enclosed and includes a CRT display unit 12, a panel pick-up unit 14, a panel load-pile feed unit 16, a photoresist dry film unwind supply roll 18, and a polyethylene film take-up roll 20. The laminator further includes a laminating station 22, at the left end of which station, as indicated in FIG. 2, a dry film cutoff knife 24 is provided. At the laminating station 22, there is further provided a pair of heated laminating rolls 26, a vacuum film feed bar 28, a left film length adjustment vacuum bar 30, a left film length adjustment knob 32, a right film length adjustment vacuum bar 34, a right film length adjustment knob 36, and intensified IR lamps 38. Additionally, the laminator 10 includes a film loop dancer control 40, a control panel 42, a panel stacker 44, vacuum film tension bars 46, an air exhaust 48, an air exhaust duct 49, and an exit delivery belt 50.

As best seen in FIG. 2, the photoresist dry film, indicated at 52, is unwound from the film supply roll 18 and drawn downwardly past a guide roll 54. At the guide roll 54, the polyethylene cover, indicated at 56, is separated from the dry film 52 and is directed upwardly to be wound on the take-up roll 20, the dry film 52 continuing in a downward path to and around the dancer control 40. From the dancer control 40, the dry film 52 is continued upwardly and over a guide roll 58 to the left film length adjustment vacuum bar 32 from where the film 52 is shown as having been drawn or extended through the laminating station 22, terminating at the vacuum film feed bar 28. When so extended, the film 52 is in proper position to be cut by cutoff knife 24 and laminated onto a panel or board.

In an operative embodiment of the invention, the automatic laminator 10 is contained within a housing or supporting frame 60 which may be made of sheet metal or other suitable material, and accommodates panels or boards 62 to be laminated, in sizes from 24"×24" (60.96 cm.×60.96 cm.) to 10"×10" (25.4 cm.×25.4 cm.). Typically, such panels 62 are made of copper.

Figure 3:
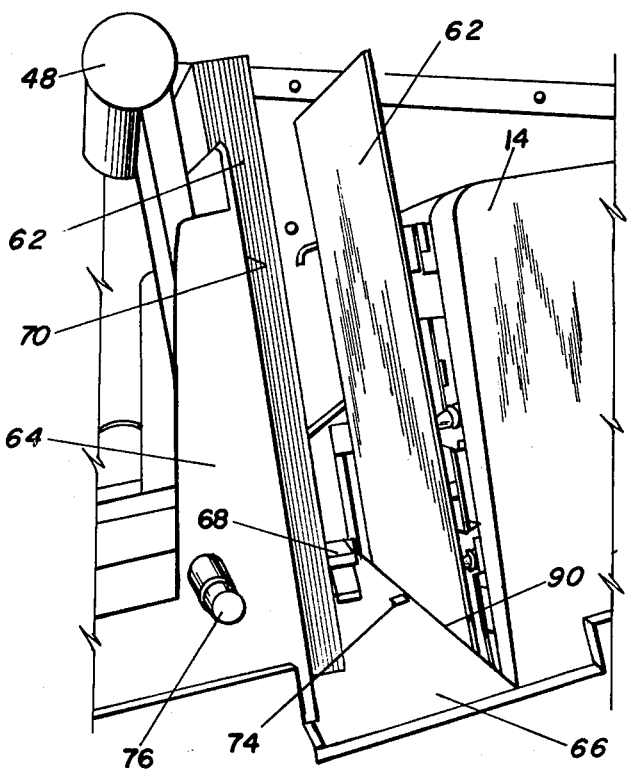
FIG. 3 is a perspective view from the front of the panel feeder with a panel supported on vacuum suckers immediately over a lamination nip, the feeder being shown retracted from the normal run position as illustrated in FIG. 2.
Figure 4:
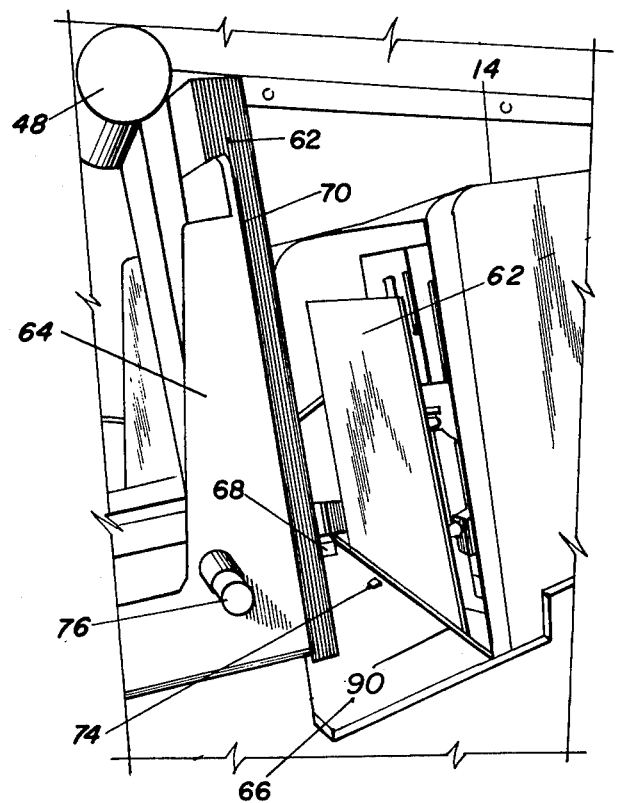
FIG. 4 is a view similar to that of FIG. 3 showing the panel feeder in a lowered or down position with a panel inserted into the lamination nip.

The panel load-pile feed unit or feeder 16 comprises a generally reverse L-shaped member 64 that is positioned for forward and aft movement or activation on a flat surface or table 66. A transversely adjustable edge guide, designated 68, as shown in FIGS. 3 and 4 of the drawings, is provided for accommodating panels 62 of different width. Member 64 includes an upwardly directed backing plate 70 for supporting a load of panels 62 to be laminated. The surface of the backing plate 70 is slanted 10° counterclockwise from the vertical direction, as shown, so that the panels 62 will stay stably in place, as stacked, until picked up by the pick-up unit 14.

Figure 5:
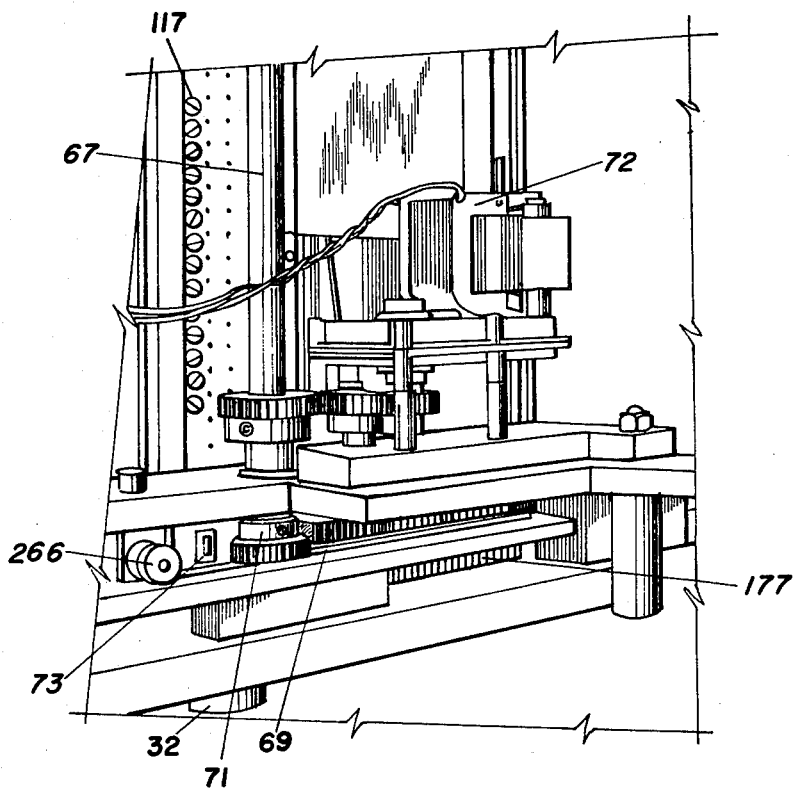
FIG. 5 is a view from the top of the laminator showing a positive drive mechanism for the pile feeder.
Figure 6:
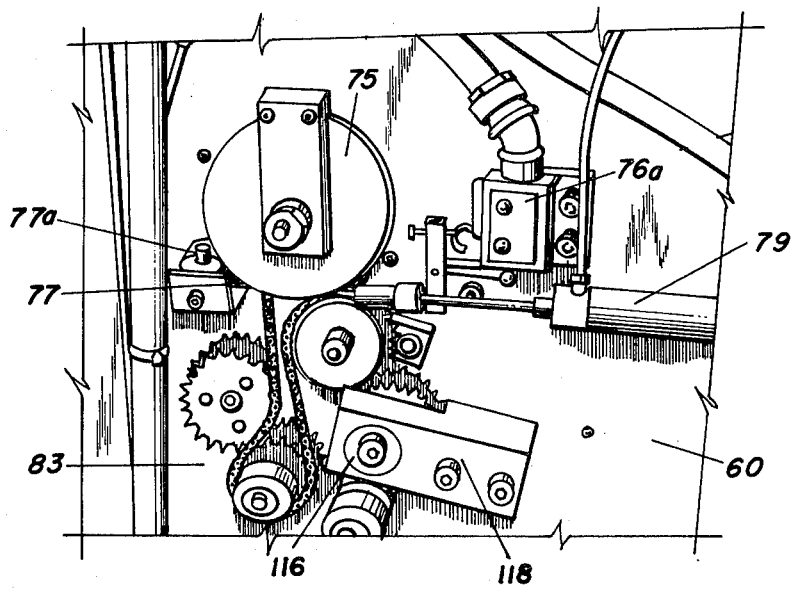
FIG. 6 is a view from the rear right side of the laminator showing the main drive for the laminating rolls and a cable clutch drive for panel feed activation.

As the panels are picked up by the pick-up unit 14, the member 64 is moved to the right, as seen in FIGS. 1–4, to advance the next successive panel 62 into position to be picked up. The means for so advancing the member 64 comprises a positive drive unit 72 including a rack 69 and pinion 71, as shown in FIG. 5, and which, in incremental steps, advances the member 64 and the panels 62 supported thereby toward the pick-up unit 14. A similar rack and pinion drive for member 64, driven from positive drive unit 72 by means of a transversely positioned rod 67, is provided at the back of the laminator 10. The drive unit 72 is controlled by a position detector 74, as seen in FIGS. 3 and 4, and which senses the forward position of each panel and actuates a switch 76, as seen in FIG. 6. For disengaging the positive drive unit 72 from the pile feed member 64, a lever 76 is provided.

Figure 7:
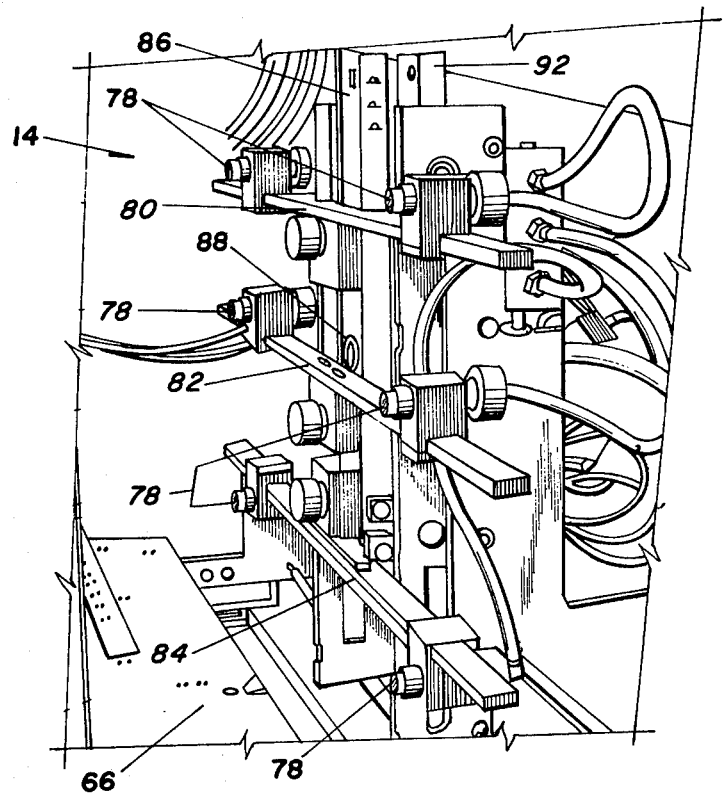
FIG. 7 is a perspective view from the front of the laminator showing the panel feed vacuum cups or suckers and supporting arms or bars.

The pick-up unit 14, as shown in FIG. 7, comprises a plurality of vacuum cups or suckers, indicated at 78, that are carried at the ends of transverse vertically spaced pneumatic cylinder driven arms or bars 80, 82 and 84, a vacuum cup 78 being carried at each end of each of the bars 80, 82 and 84. Each of the bars 80, 82 and 84 is suitably mounted midway the length thereof to a vertically disposed member 86. Member 86, in turn, is attached to a pneumatically actuated panel feeder member the end 88 of which may be seen in FIG. 7 and that is moved alternately to the left and right. This causes the plurality of vacuum cups 78 to reach out into engagement with the surface of the immediately adjacent panel 62 in the stack in panel load-pile feed unit 16 to bring it with the lower edge thereof above a lamination nip 90, as seen in FIGS. 3 and 4. During such movement the lower edge of the panel 62 actuates the position detector 74 to maintain the drive unit 72 deenergized.

Figure 8:
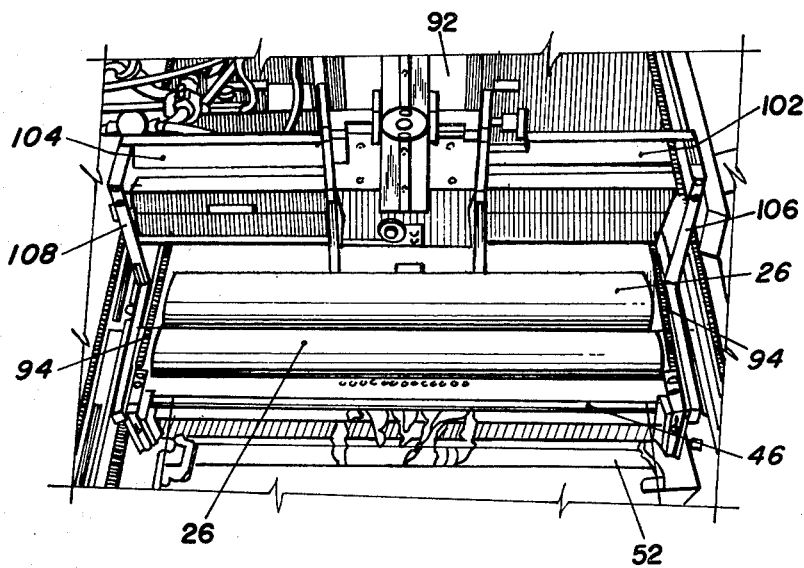
FIG. 8 is a view from the upper left end of the laminator with the panel load-pile feed or feeder removed, thus revealing the laminating rolls, the dry film tension bars, and the panel feeder with the arms or bars and vacuum cups removed.

Member 86 is attached to and is actuated downwardly by a panel feeder member 92, as seen in FIGS. 7 and 8, to move the picked up panel 62 down into the lamination nip 90 and between laminating rolls 26.

Figure 29:
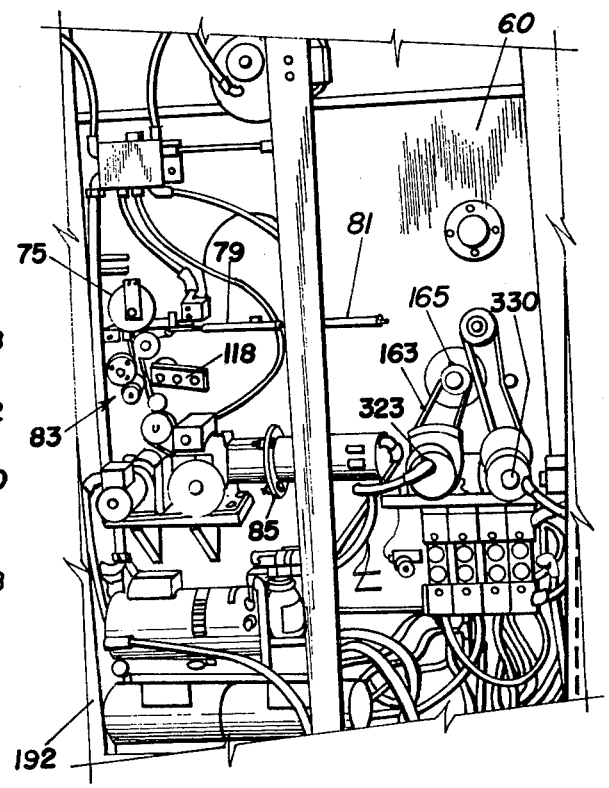
FIG. 29 is a view of the right side rear of the laminator with the door open, this side of the cabinet housing all mechanical drive vacuum and pneumatic.

The mechanism for actuating member 92 downwardly is shown in FIG. 6 and is seen to comprise a rotatable steel drum 75, a cable 77, and two air cylinders 79 and 81 that are connected "piggy back" as may best be seen in FIG. 29. The cable 77 is drawn from the air cylinder 79 one revolution around the steel drum 75. The cable 77 is turned around a first idler pulley 77a and then around a second idler pulley (not shown) that is mounted directly below the panel feeder member 92. The cable 77 makes a 90° wrap around the second idler pulley and then is directed at a 10° angle off the vertical plane counter clockwise, in angular alignment with the direction of movement of member 92 and, hence, of a panel 62 in position to be lowered into the lamination nip 90. The cable 77 is attached to the feed member 92.

The steel drum 75 is driven at the same rate of speed as the laminating rolls 26, the drive for the drum 75 and the rolls 26 being by a chain drive mechanism 83 from a motor 85, as seen in FIGS. 6 and 29. Since the cable 77 is wrapped around the drum 75, actuation of the cylinders 79 and 81 causes the cable 77 to be pulled and tightened on the drum 75. This causes the cable 77 to be driven by the drum 75, which, in turn, causes the feeder member 92 to descend. This brings a panel 62 down into engagement with the film 52. A second such stroke brings the panel 62 down into the nip 90 and into engagement with the laminating rolls 26. An air cylinder (not shown), acting as a spring, continuously biases the panel feeder member 92 upward and restores the panel feeder member 92 to its initial upper position shown in FIG. 7.

FIG. 8, which is a view from the upper left end of the laminator 10 with the panel load-pile feed unit 16 removed, shows the laminating rolls 26. In FIG. 8, the panel feeder member 88 with the member 86, the arms or bars 80, 82, 84 and the vacuum cups 78 associated therewith are also shown removed. There is also shown, in FIG. 8, one of the pair of film tension bars 46 with the dry film 52 passing thereover.

Figure 9:
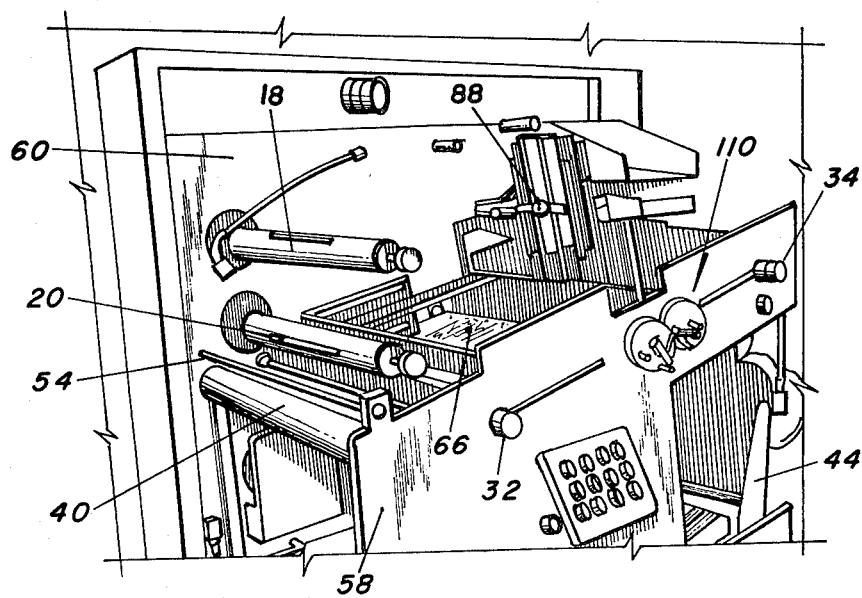
FIG. 9 is a perspective view from the left end of the laminator with the panel load-pile feed, and panel feeder removed.

The film unwind supply roll 18, polyethylene film take-up roll 20, dancer roll 40, guides rolls 54 and 58, and film length adjustment knobs 32 and 34 are shown in FIG. 9.

For precisely controlling the film to panel position during the downward movement of the member 86, there is provided at the front and also at the back of the laminator 10, outboard of the film 52 and the laminating rolls 26, a chain 94 between the tension bars 46 which normally are held in their extreme extended positions by suitable spring means 96 and 98, as shown in FIG. 10. Each chain has a respective center locating link 100.

Carried by the member 92, as shown in FIG. 8, are cross bars 102 and 104 from each of which a respective forked member 106 and 108 depends. The forked members 106 and 108 are each adapted to engage the centering link 100 of a respectively associated chain 94 as each of the successive panels 62 is moved down into engagement with the film 52, through the laminating nip 90, and between the laminating rolls 26. As seen in FIG. 10, the tension bars 46 are each normally in an extended position, being biased away from each other by a respectively associated spring 96 and 98. Upon engagement of the forked members 106 and 108 with the centering link 100 associated therewith and continued downward movement, the tension bars 46 are moved toward each other against the opposing force of its associated spring 96, 98 and into engagement with the film 52. By this means any tendency for the panel 62 to skew with respect to the film 52 is avoided and the pre-cut film 52 is folded about the opposite sides of the panel 62 just as precisely as it would had it been possible to provide a crease line in the film.

Figure 11:
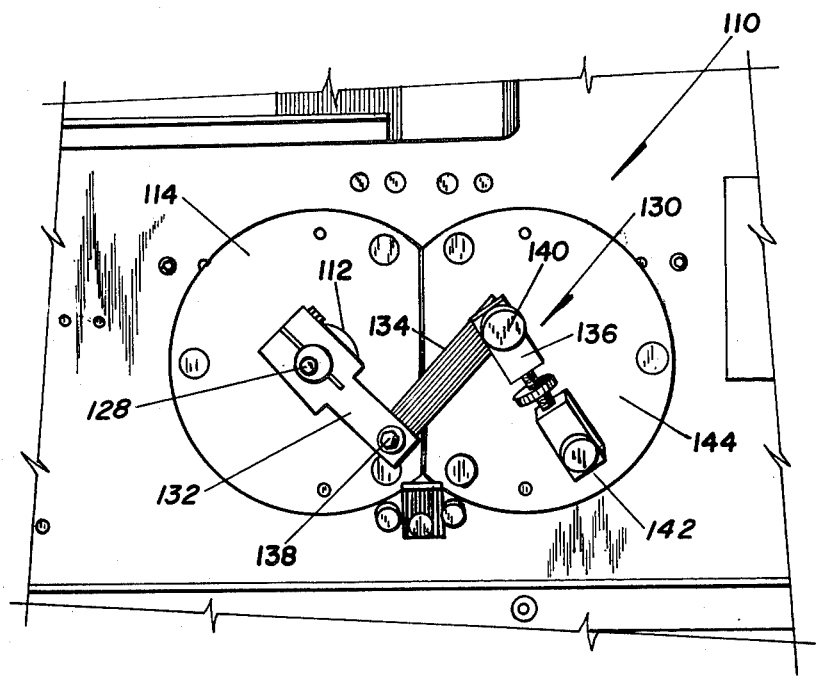
FIGS. 11-16 illustrates a pressure activation device employed for use with the laminating rolls, FIGS. 11 and 12 showing the device in the "OFF" and in the "ON" positions, respectively, FIGS. 13 and 14 showing a bearing employed in the device at the front of the laminator, and FIGS. 15 and 16 showing the bearing employed in the device at the back of the laminator.
Figure 12:
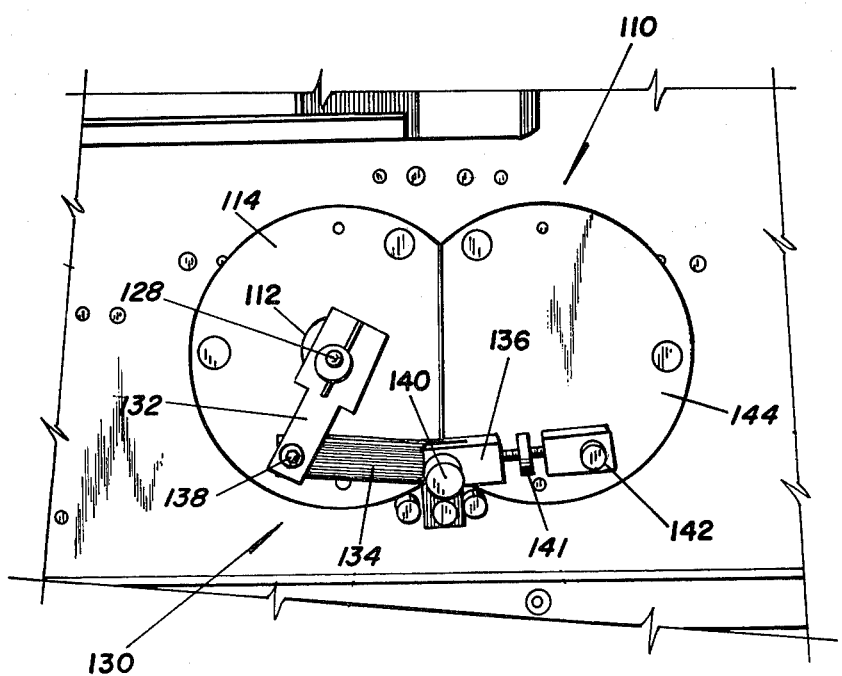
Figure 14:
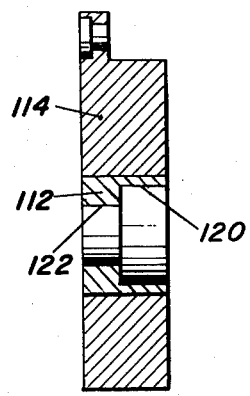
Figure 13:
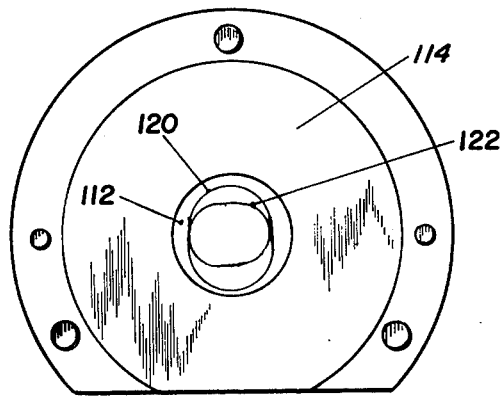
Figure 15:
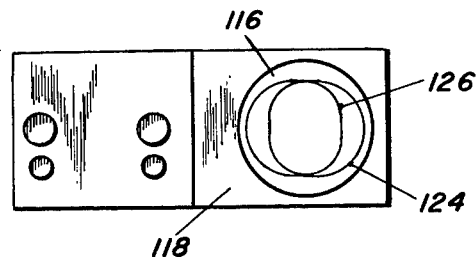
Figure 16:
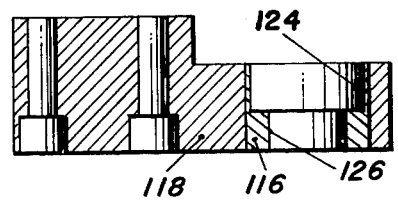

In FIGS. 11-16 there is illustrated a laminating roll activation device 110 for bringing the laminating rolls 26 together under pressure in a linear motion, that is, with no shifting of the plane in which the axes of the rolls 26 are located for laminating the dry film 52 to each of the successive of panels 62, and for relaxing the pressure of the rolls 26 when the laminator 10 is in an inactivated mode. To this end, one of the laminating rolls 26 is mounted on a shaft having eccentric ends. A double cut bearing mounted in a bearing cartridge supports each of the shaft ends. Thus, as seen in FIGS. 12 and 13, a double cut bearing 112 is mounted in a disk-like member or plate at the front of the laminator 10. At the back of the laminator 10, a double cut bearing 116 is formed in a rectangular plate 118. The double cut bearings 112 and 116 each provide openings therein that are positioned at 90° to each other for support of the concentric and eccentric shaft ends. Specifically, openings 120 and 122 in bearing 112 support the concentric and eccentric ends of the shaft at the front of the laminator. Openings 124 and 126 support the concentric and eccentric ends of the shaft at the back of the laminator.

In FIGS. 11 and 12 the eccentric end of the laminating roll shaft is shown at 128. For rotating the eccentric end 128 and thereby the shaft there is provided a linkage 130 comprising first, second and third links 132, 134 and 136, respectively. The first link 132 has one end fastened tightly to the eccentric end 128 and the other end pivoted by a pin 138 to one end of the second link 134. The other end of the second link 134 is pivoted by a pin 140 to one end of the third link 136. Pin 140 is provided with a knurled knob which serves as the actuation member. The other end of the third link is pivoted by a pin 142 to a disk-like plate 144 of the laminator 10. The third link 136, includes the thumb wheel and a screw adjustment 141 for varying the length of the third link 136, and thereby the extent to which the pressure of the laminating rolls 26 may be relaxed by the activation device 110. FIG. 11 shows the linkage 110 in the "OFF" position, that is, the position in which the laminating rolls are free to separate slightly. FIG. 12 shows the linkage 110 in the "ON" position, specifically, the position in which the laminating rolls are brought together under pressure to press and laminate the dry film to a panel 62 passing between the rolls 26 and drawing a sheet or strip of dry film 52 about its opposite sides.

Plates 114 and 144 are suitably fastened to the supporting frame or housing 60 of the laminator 10 at the front thereof. Similarly, rectangular plate 118 is suitably fastened to the housing 60 at the back of the laminator 10, as indicated in FIGS. 6 and 29.

Figure 17:
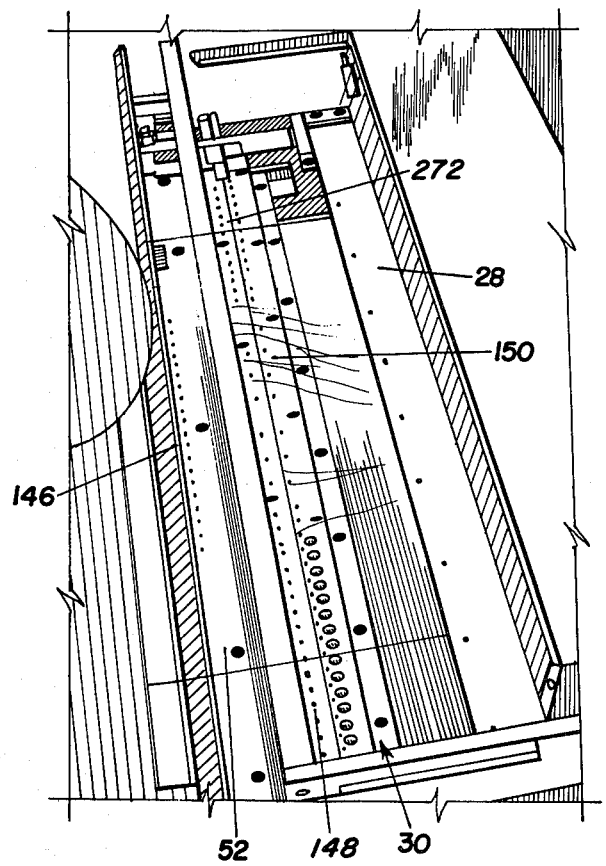
FIG. 17 is a view from above the left end of the laminating station and shows the dry film hold cutoff bar with the film held by the film feed bar shown to the right.

FIG. 17 shows the film hold cutoff vacuum bar 30 positioned transversely of the laminator 10 immediately below the film 52 with the film 52 being held by the film feed vacuum bar 28 which, as shown, also is disposed transversely of the laminator 10. Three separate vacuum bars are formed in the same member 30. Each such separate vacuum bar includes a plurality of sets of spaced vacuum cavities which, in FIG. 17 and in FIGS. 37-42, have been designated by reference numerals 146, 148 and 150. Vacuum cavities are provided on the underside of vacuum bar 28 and not visible in FIG. 17. Vacuum bar 34, as also seen in FIGS. 37-42, includes a set of spaced vacuum cavities. For convenience, the sets of spaced vacuum cavities 146, 148 and 150 are designated hereinafter as first, second and third vacuum bars, the vacuum bar 34 is designated a fourth vacuum bar, and the vacuum bar 28 is designated a fifth vacuum bar.

Figure 18:
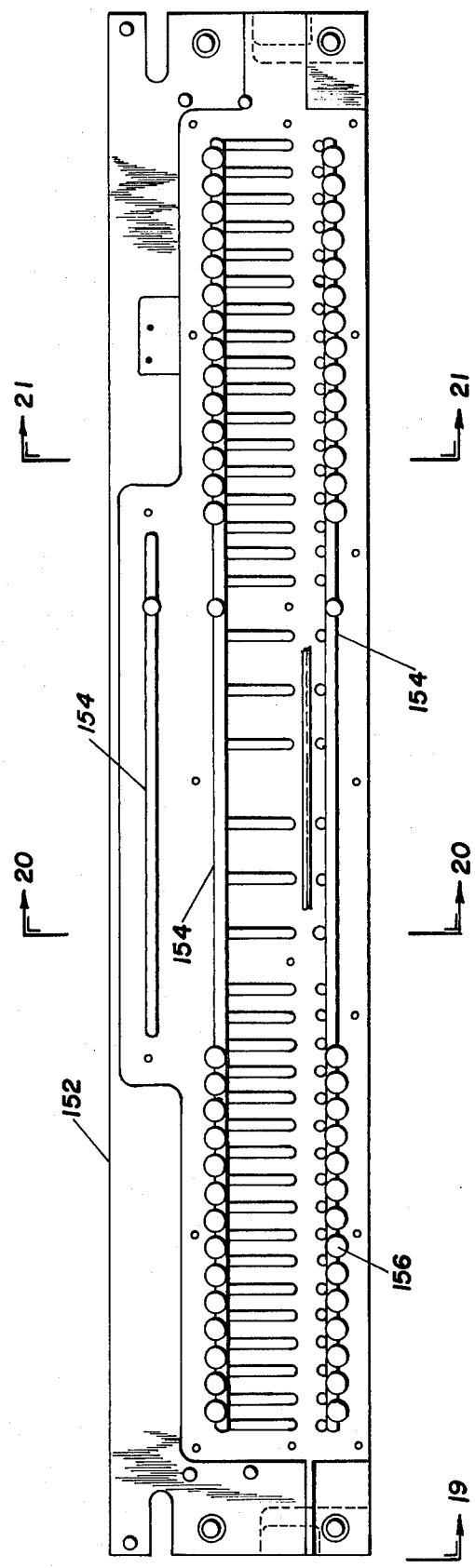

A detail view of the base structure, designated 152, of the hold cutoff vacuum bar 30 is provided in FIGS. 18-22. FIG. 18 is a top view and shows the many passages that lead to one or another of the plurality of sets of spaced vacuum cavities 146, 148 and 150, which passages for convenience have collectively been designated by reference numeral 154. FIG. 18 also shows a plurality of vacuum valve cavities, collectively designated 156, for varying the number of vacuum cavities that are active transversely of the laminator 10, in increments of one-half inch.

Figure 21:
Figure 20:
Figure 19:

FIGS. 19-21 are cross sectional views taken along the lines 19—19, 20—20, and 21—21, respectively, of FIG. 18.

FIG. 22 is a top view of the cover plate designated 158, for the base structure 152 of the hold cut off vacuum bar 30, and shows in detail the plurality of sets of vacuum cavities 146, 148 and 150.

The film feed vacuum bar 28 is chain driven and is adapted to be moved from the extreme left position of the laminating section 22, as seen in FIG. 2, to a position to the right thereof. When in the extreme left position, the vacuum cavities on the bottom of the bar 28 pick up the film 52 and draw it to the right a distance determined by the adjusted positions of the film length adjustments 30 and 34, the vacuum cavities on the vacuum bars 146, 148 and 150 meanwhile having been inactivated.

Figure 23:
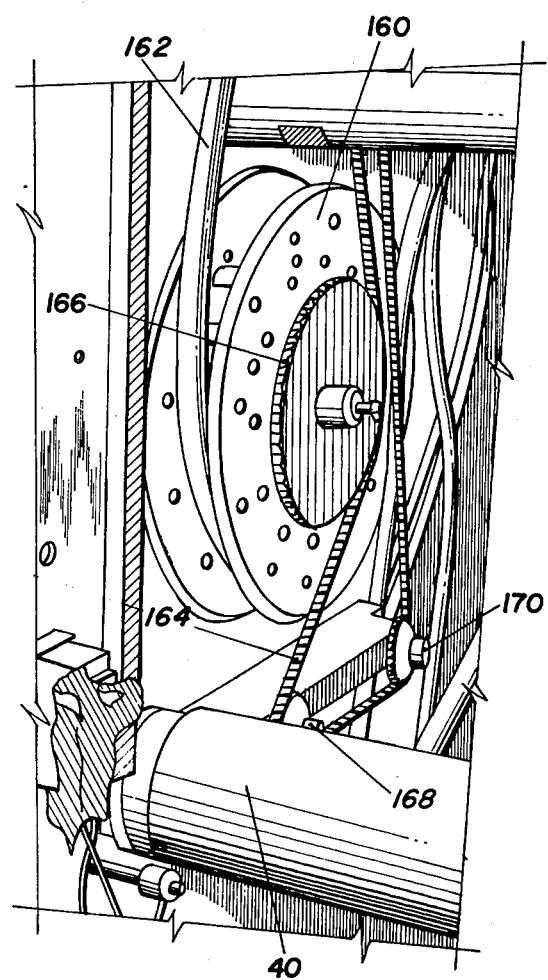
FIG. 23 is a view from the left end of the laminator with the cover removed showing the vacuum hose reel that is used to control vacuum hose attached to the film feed bar, and showing also the film loop dancer control.

In FIG. 23, there is shown a view of the laminator 10 from the left end showing a hose reel 162 that is employed to control a vacuum hose 120 that is attached to the film feed vacuum bar 28. Also shown in FIG. 23 is the film loop dancer control 40 and a chain 164 that is used to drive the vacuum hose reel 160. Chain 164 is in driving engagement with a sprocket wheel 166 that is fixedly attached to the hose reel 160 and also with idler sprocket wheels 168 and 170. At its highest point, not visible in FIG. 23, the chain 164 goes around a drive sprocket on the drive shaft for the film feed vacuum bar 28, which drive shaft extends through the back panel of the laminator 10. This drive shaft, as seen in FIG. 29, is actuated by a D.C. servomotor motor 323 through a chain 163 and a clutch 165 that is provided for "slippage". In FIG. 29, the other motor 330 drives the take-up shaft 20 for the polyethylene cover 56.

The film feed vacuum bar 28 also is chain driven and is moved through the lamination section 22 from the extreme left position with the vacuum cavities thereof activated, the vacuum hose 162 being unwound from reel 160 to allow such movement unhindered by the vacuum hose connections. Similarly, upon return of the film feed vacuum bar 28 to the extreme left position of the lamination section 22, the vacuum hose 162 is wound upon the reel 160.

By reference to FIGS. 1 and 2, it will be noted that, in accordance with the invention, the path of the dry film 52 through the lamination section 22 is disposed at an upward slant of 10°. The path of the film 52 is disposed at such an upward slant so that each of the successive panels 62 will engage the film 52 substantially at a 90° angle as the panels 62 are moved downwardly through the lamination rolls 26, the panels 62 in the panel load-pile feed 16, as noted hereinbefore, being slanted 10° counterclockwise from the vertical so that the panels 62 will stay in place until picked up by the pick-up unit 14.

Figure 24:
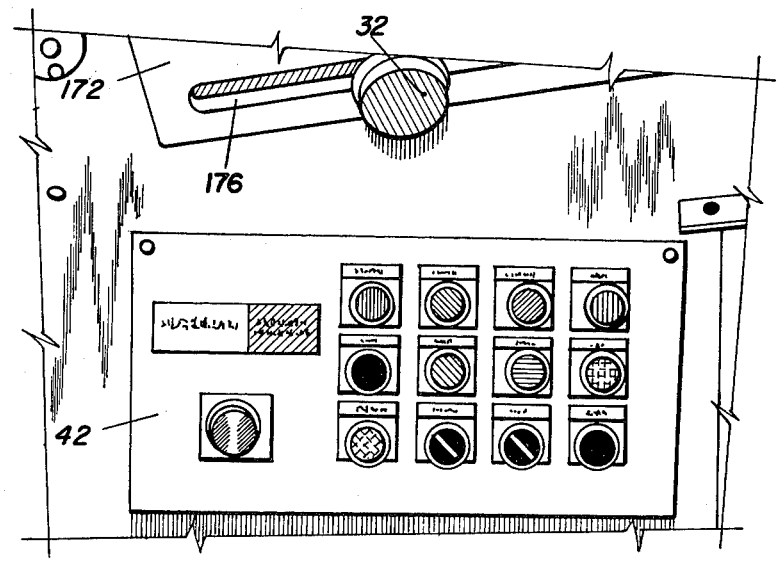
FIG. 24 is a front view showing the control panel and the left side film length adjustment.
Figure 25:
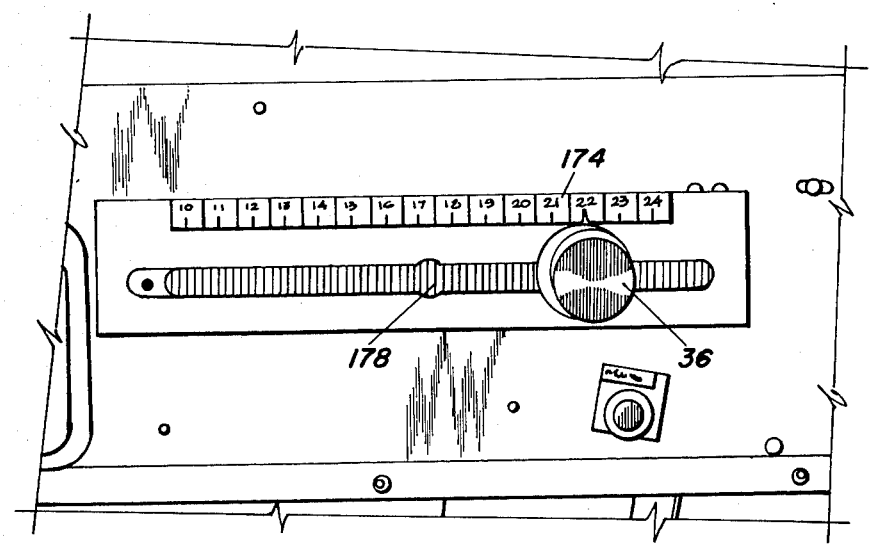
FIG. 25 is a front view showing the right side film length adjustment.
Figure 34:
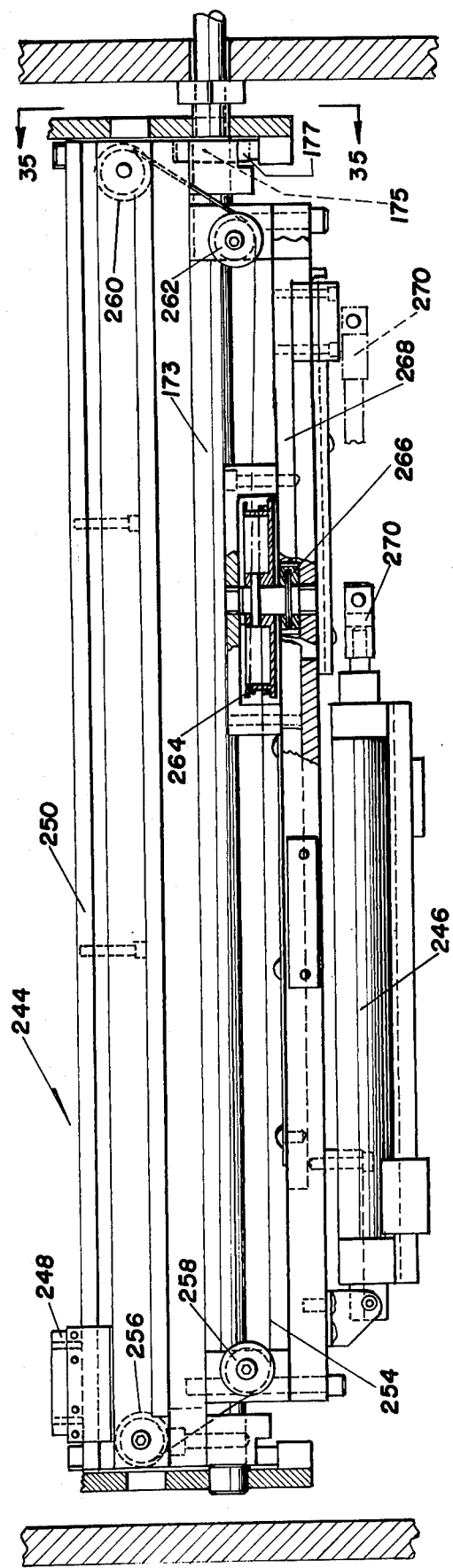
FIG. 34 illustrates the cutoff vacuum bar assembly.
Figure 34A:
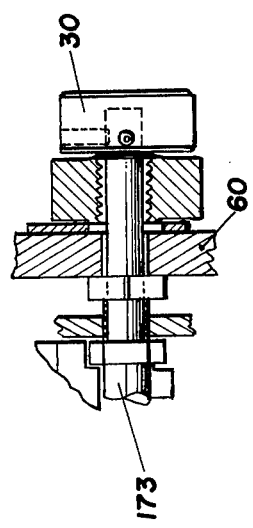
FIG. 34A shows a detail of the left film length adjustment mechanism.

For controlling the length of the dry film 52 that is drawn into the laminating section 22 by the vacuum film feed bar 28, there is provided, as shown in FIGS. 2 and 24, a left side film length adjustment comprising the knob 32 and a calibrated scale 172, and also a right side film length adjustment, as shown in FIG. 25, comprising the knob 36 and a calibrated scale 174. The knob 32 is attached to a shaft 173 that extends through a slot 176 in the scale 172 and has attached to the inner end thereof a pinion 175 that rests on a rack 177, as seen in FIGS. 5, 34 and 34A. The knob 36 is similarly attached to a shaft (not shown) that extends through a slot 178 in the scale 174 and which cooperates with a rack and pinion for adjusting the position of the vacuum bar 34. By this means and the use of knobs 32 and 36 that desirably include a locking feature, the length of dry film 52 that is drawn into the lamination section 22 may be precisely determined and so proportioned on the opposite sides of the laminating nip 90 as to fold with equal lengths on opposite sides of the panels 62 being laminated.

The control panel 42 for the laminator 10 is also shown in FIG. 24 and is seen to comprise pushbutton and selector switches for controlling the feeder cycle, the film cycle and the laminating cycle, pushbuttons for controlling the vacuum pump, a reset button for controlling the automatic cycle and clearing malfunctions, a selector switch for controlling the IR lamps, a selector switch for controlling unwind and panel pile feed, and three pushbuttons for controlling the laminating rolls 26.

Figure 26:
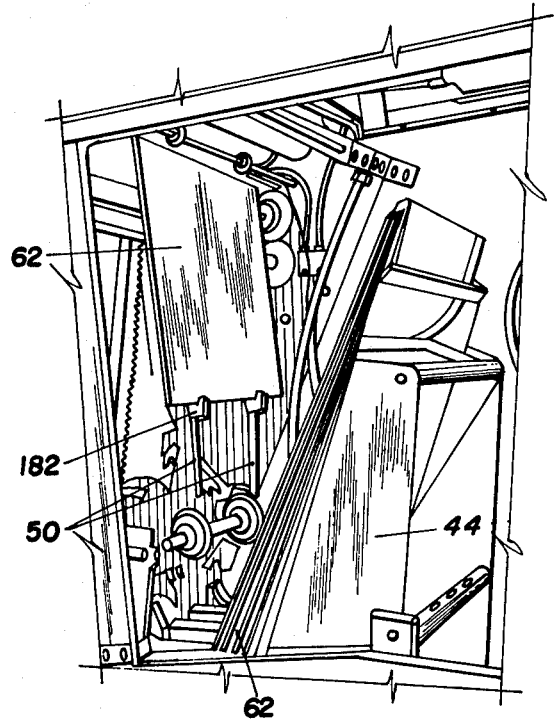
FIG. 26 is a perspective view from the front showing a laminated panel exiting the lamination nip, being lowered on delivery belt lugs, and showing laminated panels in a delivery stack in a lean-to manner.

In FIG. 26 there is illustrated a view from the front of the laminator 10 showing a laminated panel 62 exiting the lamination rolls 26 and being lowered on delivery belt lugs 182 carried by spaced delivery belts 50 for delivery to the panel stacker 44, several other panels 56 having already been deposited in the stacker 44 and arranged in lean-to fashion.

Figure 27:
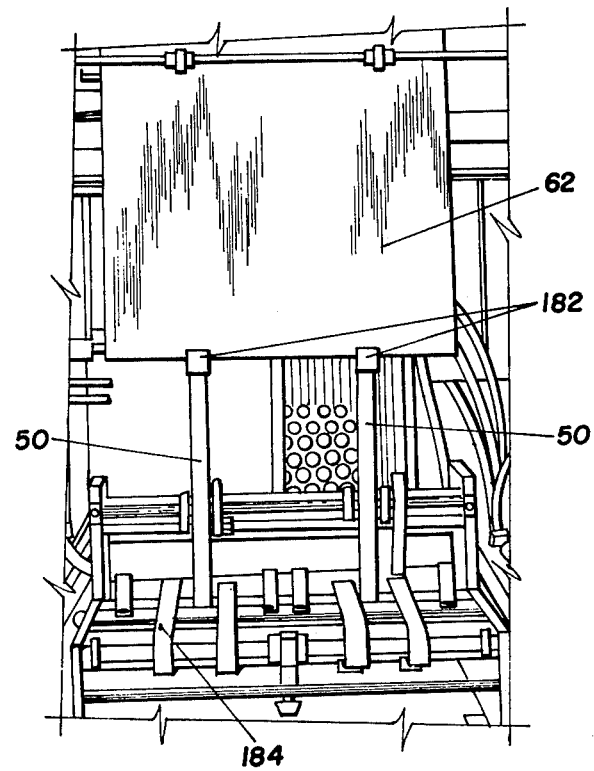
FIG. 27 is a view from the lower right end of the laminator with the delivery stacker removed, showing a laminated panel in the same position as in FIG. 26, and showing delivery belts to facilitate stacking of panels.

FIG. 27 is a view from the right end of the laminator with the delivery stacker 44 removed, with a panel 62 exiting the lamination rolls 26 being in substantially the same position as the panel 62 in FIG. 26. For facilitating stacking of the panels, horizontally positioned delivery belts indicated at 184 are provided.

For supporting the film 52 after it has been drawn through the laminating station 22 and has been cut, there is provided, as seen in FIG. 2, two pieces or strips of plastic 186 and 188 upon which the dry film 52 rests when in the laminating station 22. As shown, one strip 188 extends between the left film length adjustment vacuum bar 30 and the heated rolls 26, and the other strip 186 extends between the right film length adjustment vacuum bar 34 and the heated rolls 26, each of the strips 186 and 188 being suitably supported at both of its ends by means not shown. By this means the ends of the film 52 in the laminating station 22 are prevented from dropping down over the IR lamps 38 as the film 52 is being folded over the opposite sides of a panel in the laminating rolls 26.

Figure 28:
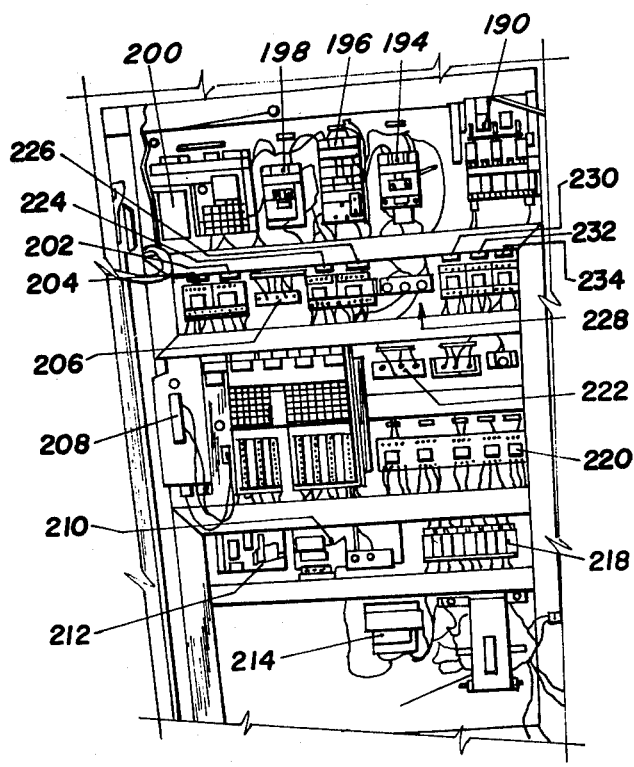
FIG. 28 is a view of the left side rear showing the electrical controls and main disconnect switches, a common bulkhead being provided between this side rear and the right side rear as seen in FIG. 29.

In FIG. 28, there is illustrated a view from the left side rear of the laminator 10 showing all of the electrical controls, the main disconnect switch as indicated by the reference numeral 190 being mounted on this side of the housing or enclosure 60. An overall picture of the view from the back of the enclosure 60 may be obtained by viewing FIG. 28 and FIG. 29 side by side, there being a common bulkhead indicated at 192 between them. The side of the housing 60 shown in FIG. 29 contains all mechanical drive, vacuum and penumatic.

The electrical controls and devices illustrated in FIG. 28 further include a Master Control 194, a 1 MTR vacuum pump control 196, an HTR No. 1 heat 198, an IR lamp control 200, a #2CR control relay 202, a #3CR control relay 204, a D.C. motor control 206, a PLC microprocessor 208, a 5-volt D.C. Power Supply 210, an OP CON Photopickup Amplifier 212, an OMEGA 199 Digital Thermometer 214, a 1T control transformer 216, Fuses 3–11 indicated at 218, control relays 9CR, 10CR and CRI (control relay interlock) indicated at 220, a D.C. motor control unit 222, a #4CR control relay 224, a #5CR cotrol relay 226, a #1, #2, and #3 potentiometer indicated at 228, a 6CR control relay 230, a #7CR control relay 232, and a #11CRR control relay 234.

A feature of the invention is the use of the OMEGA 199 Digital Thermometer 214 in cooperation with a button-type thermocouple 236 that is suitably mounted closely adjacent the surface of one of the laminating rolls 26, as seen in FIG. 2. The thermometer 214 reads out the temperature of the laminating roll 26. The IR lamp controller 200 maintains the energization of the IR lamps 38 as required to maintain the temperature of the laminating roll 26 at a predetermined value, typically 250° F., the response of the thermocouple 236 and the SR controller 200 being very fast thereby to maintain the temperature of the laminating rolls precisely at the desired value. The temperatures of the surfaces of both laminating rolls 26 is substantially the same even though the temperature of one roll only is measured since they are in rolling contact.

Figure 30:
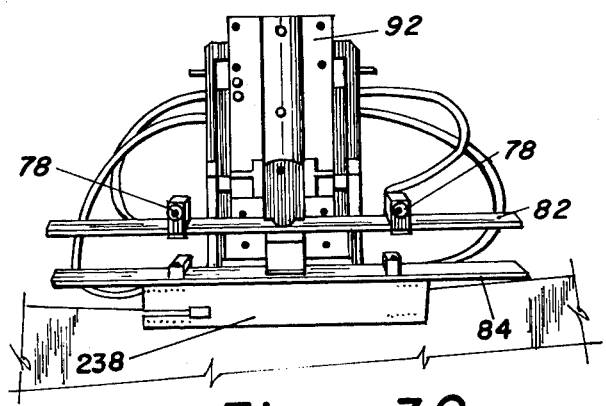
FIG. 30 is a view from the upper left end of the laminator with the load-pile feed unit removed showing a modified panel feeder with a special thin panel attachment mounted to the lower bar having utility for feeding very thin panels such as 0.007" thick innerlayers.

FIG. 30 is a view from the upper left end of the laminator 10 with the panel load-pile feed unit 16 removed and showing a modification of the panel pick-up unit 14 including a special thin panel attachment 238 mounted to the lower arm or bar 84. This attachment 238 is used for feeding very thin panels or boards such as 0.007 inch (0.01778 cm.) thick interlayers.

FIGS. 31–33 show the panel attachment of FIG. 30 in greater detail, FIG. 31 being a top plan view thereof and FIG. 32, a bottom view. FIG. 33 is a longitudinal edge view and shows a slight undulation indicated by reference numeral 240 in the surface 242 of the attachment 238 that faces the thin panel 62 being picked up. This undulation has a stiffening effect on the thin panel as it is picked up and thus stabilizes the panel as it is moved down into the laminating nip 90 to be laminated.

Figure 35:
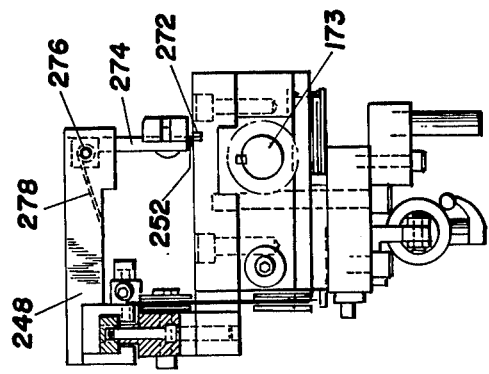
FIG. 35 is a cross sectional view of the cutoff bar assembly taken along the lines 35—35 of FIG. 34.

FIG. 34 is a view of the cutoff vacuum bar assembly of the laminator 10, which for convenience, has been designated by the reference numeral 244, and is driven by an air cylinder 246. The assembly 244 includes a blade carrier 248 that is adapted to be reciprocated transversely of the laminator 10 and of the film 52, sliding on a beam 250, and which carries a cutting knife, specifically a razor blade 252, as seen in FIG. 35. FIG.

35 is a cross sectional view taken along the lines 35—35 of FIG. 34. The blade carrier 248 is attached to a cable 254 that is guided by pulleys 256, 258 located at the back of the laminator 10, as seen in FIGS. 1 and 2, and by pulleys 260 and 262 located at the front of the laminator. The cable 254 is driven by the cylinder 246 through a pulley 264 about which the cable 254 is wrapped and by a rack and pinion mechanism comprising a pinion 266 and a rack 268 that is attached at one end to the end of the movable rod 270 of the cylinder 246. In FIG. 34 the rod 270 of the cylinder 246 is shown in its fully extended position. In this position the blade carrier 248 is in its start position at the back of the laminator 10 with the cutting knife or razor blade 252 adapted to enter a cutting slot 272, as seen in FIG. 35 and also in FIG. 17 for cutting the film 52.

As seen in FIG. 35, the blade carrier 248 includes a depending arm 274 upon which the blade 252 is mounted and which is pivoted at 276 to the carrier 248, being biased downwardly by a spring 278. The purpose the pivot 276 and spring 278 is to allow the vacuum film feed bar 28 to rock the depending arm 274 out of the way to allow maximum movement of the vacuum film feed bar under carrier 248 to the left hand position thereof, as seen in FIG. 2.

Figure 36:
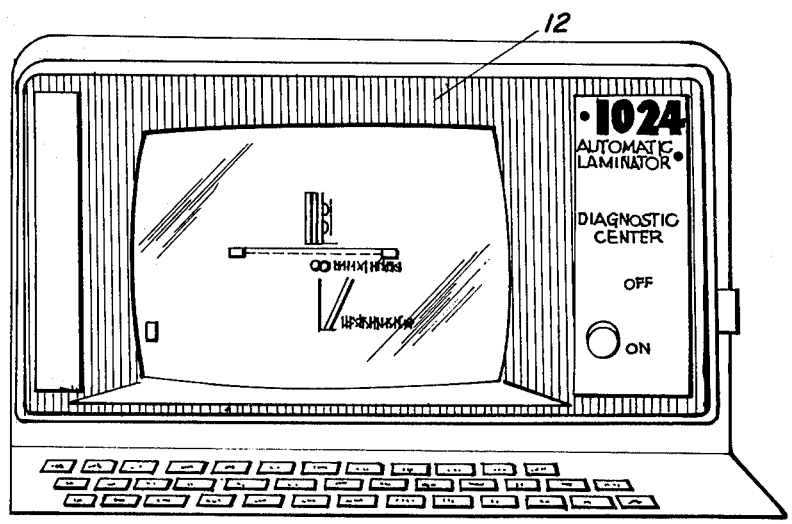
FIG. 36 is a view illustrating the CRT graphic display unit.

FIG. 36 is a view illustrating the CRT graphic display unit 12. This graphic display 12 may comprise an Allen Bradley T-3 Industrial Terminal used for programming, troubleshooting and graphic display.

In FIGS. 37 through 42 there is illustrated the sequence of operations of the laminator 10 in automatically feeding the film 52, cutting the film 52 precisely to a predetermined length, picking up each of the successive panels 62 in turn to be laminated, advancing such panel through the heated laminating rolls 26, and delivering the laminated panel to the panel stacker 44. For convenience in describing this operation, the sequence of events has been broken down into six different states or status conditions, as described hereinafter.

Figure 37:
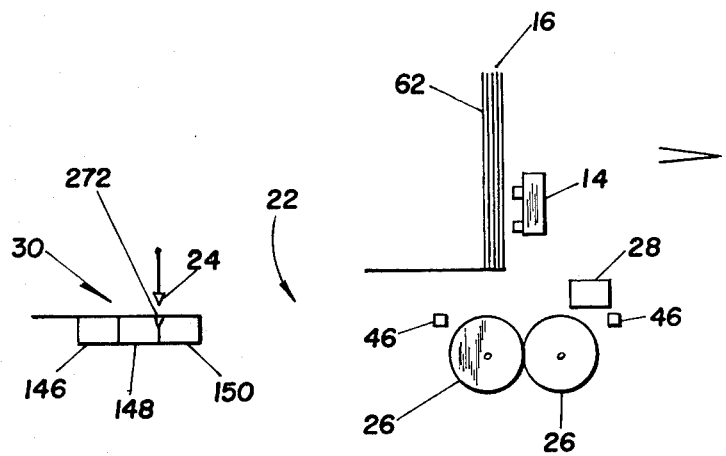
FIGS. 37 through 42 schematically illustrate the sequence of operations of the automatic laminator.

Status 1—In this state, as shown in FIG. 37, the film feed vacuum bar 28 is shown in a position immediately above and to the right of the heated lamination rolls 26, a position for convenience designated film feed bar position #1, the vacuum cups 78 of the panel pick-up unit 14 are in a position retracted from the panels 62, and the film cutoff knife 24 is held in a retracted inactive position. Tension bars 46 are each in a retracted inactive position.

Figure 38:
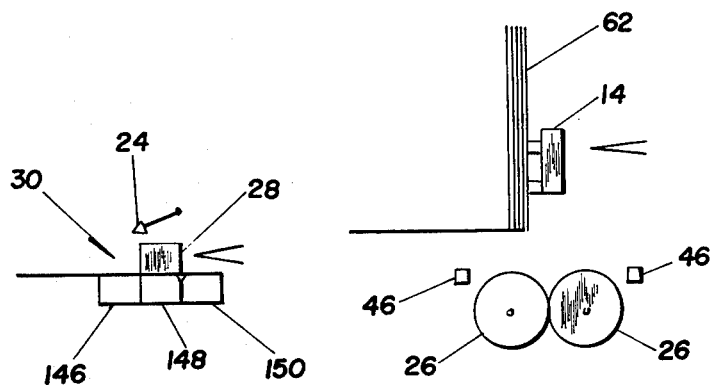

Status 2—Here, as shown in FIG. 38, the film feed vacuum bar 28 has been moved to the left through the laminating section 22 to the extreme left position, a position for convenience designated position #2, in order to pick up the film 52, and the vacuum cups 78 of the panel pick-up unit 14 have been thrust forward into contact with the facing surface of the immediately adjacent panel 62, the tension bars 46 each remaining in an inactive position.

Figure 39:
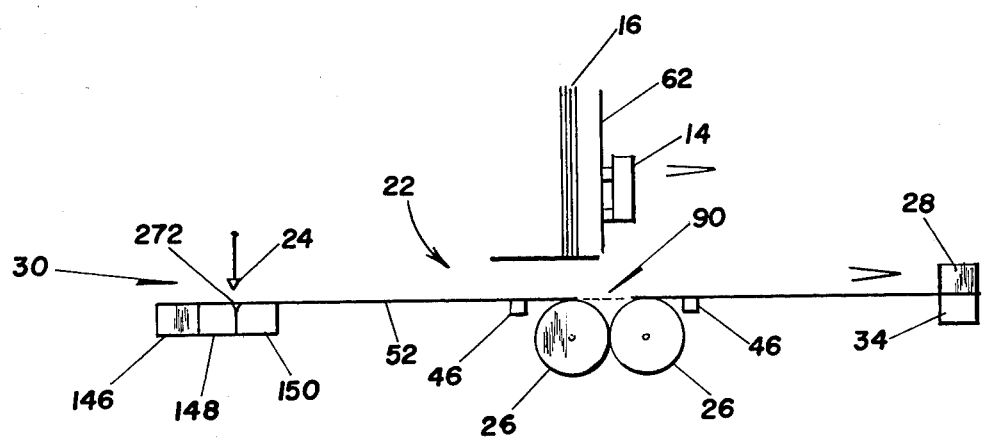

Status 3—The film feed vacuum bar 28, as shown in FIG. 39, has been moved to the right through the laminating section 22 to a position for convenience designated position #3, pulling the film 52 along with it through the laminating station 22. Meanwhile, the panel pick-up unit 14 has picked a single panel 62 from the stack and moved it to the right over the lamination nip 90, and the tension bars 46, have been activated to engage the lower surface of the film 52 for tensioning the film 52.

Figure 40:
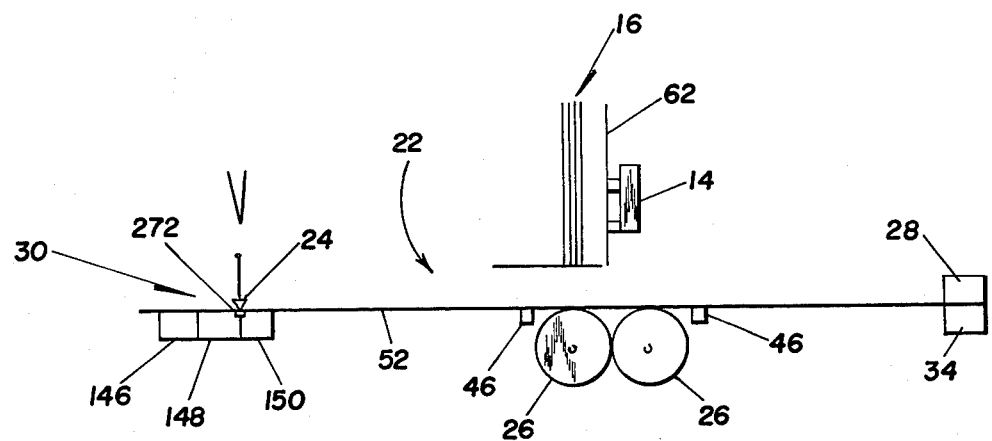

Status 4—As shown in FIG. 40, the film cutoff knife 24 is moved into cutting engagement with the film 52 and is pulled transversely of the film in the cutting slot 272 of the film hold vacuum bar 30 to the other side of the film 52 thereby severing the latter; the tension bars 46 being retained in the activated tensioning positions during such cutting action.

Figure 41:
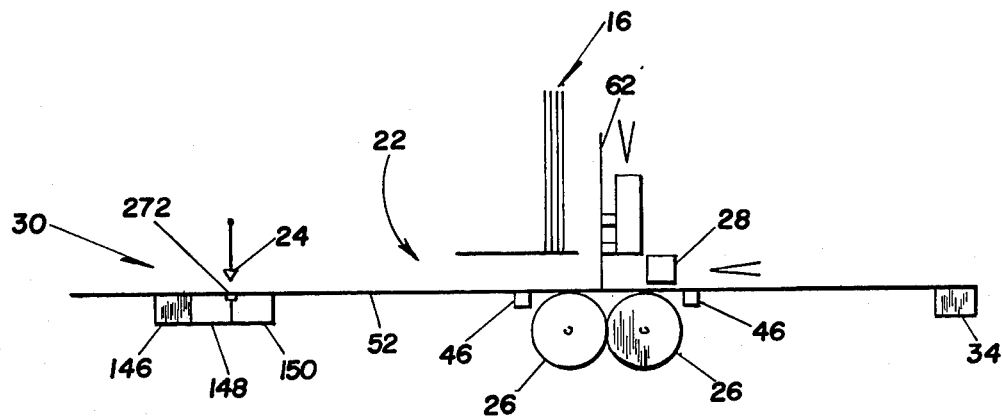

Status 5—Here, as seen in FIG. 41, the panel pick-up unit 14 is activated downwardly to move the lower end of panel 62 down into engagement with the upper surface of the film 52. Meanwhile, the cutoff knife 24 has been moved into an inactive position and the film feed vacuum bar 28, after releasing the end of the film 52 at the extreme right position, has been moved to the left to the #1 position, that is, a position immediately above and to the right of the lamination rolls 26. It is noted that the extreme right end of the film is now held by the feed hold vacuum bar 34, the extreme left end of the film being held by the feed hold vacuum bar 30.

Figure 42:
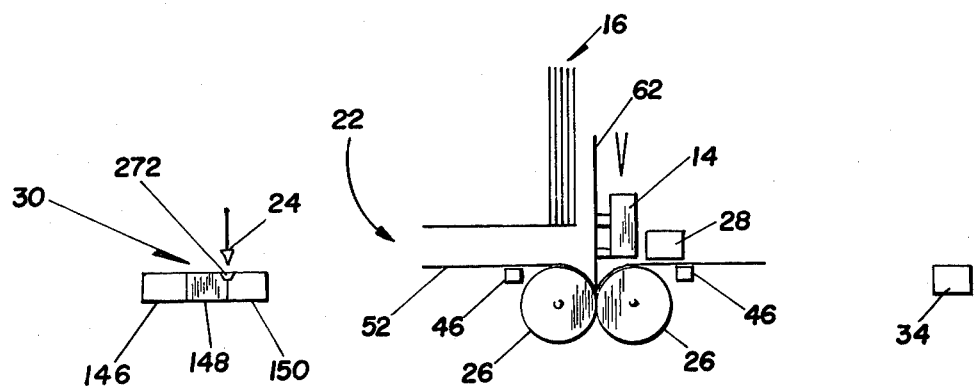

Status 6—During this status condition the feed hold vacuum bars 30 and 34 are deactivated. As shown in FIG. 42, the panel pick-up unit 14 is here being activated downward to move the panel 26 down through lamination nip 90 and through the lamination rolls 26, meanwhile pulling the film 52 downwardly and folding the film 52 into engagement with the opposite sides of the panel 62. The lamination rolls 26 are heated by the IR lamps 38 and heat the film 52 as it is pressed into tight engagement with the panel 62 thereby providing a laminated structure. The laminated panel 62 is delivered to the stacking unit as illustrated in FIGS. 26 and 27. Upon release of the laminated panel 62 by the pick-up unit 14 and the return of the latter to its upper position as shown in FIG. 37, the laminator 10 is restored to the Status 1 condition and is ready to effect the lamination of another panel 62.

The vacuum system, designated 280, of the laminator 10 and the operation thereof is illustrated in the schematic diagrams shown in FIGS. 43 through 47. As will be noted, FIGS. 43-47 are alike except for showing the film feed vacuum bar 28 in different positions and for the different piping connections resulting from actuation of the several vacuum valves during the sequencing of the laminator 10 through the several states of operation thereof, as above described.

Each of FIGS. 43-47 includes a vacuum pump 282 and a vacuum tank 284 having piping connections to vacuum valves 286, 288, 290, 292 and 294, and a vacuum operated switch 296. Vacuum tank 284 is a twin cavity tank, one cavity being provided with a check valve 298 and the other with a check valve 300 to minimize effects of vacuum drop in the film feed in the event of malfunction in the panel feed and vice versa. A muffler 302 may be provided in association with pump 282, as shown. A check valve 304 and regulator 305 are connected to the junction of pump 282 and check valves 298 and 300.

Valves 286, 288, 290, 292 and 294 are two position valves that are actuated as described in FIGS. 48 and 49, and are connected by suitable flexible pipes or tubes to the panel feeder and to the several film feeding, holding and tensioning vacuum bars, as indicated. Specifically, vacuum valve 286 has piping connections to the vacuum valve 288, the hold cutoff vacuum bar 148 and the film feed vacuum bar 28. Vacuum valve 288 has piping connections to the hold cut off vacuum bar 148, the left film hold vacuum bar 150 and the right film hold vacuum bar 34. Vacuum valve 290 has piping connections to the left and right film tension bars, each being designated by the numeral 46. Vacuum valve 292 has piping connections to the panel feeder unit 14 and to the vacuum switch 296, the latter serving, when actuated, to indicate pick-up of a panel or board 62. Vacuum valve 294 has a single piping connection to the film hold vacuum bar 146.

Figure 43:
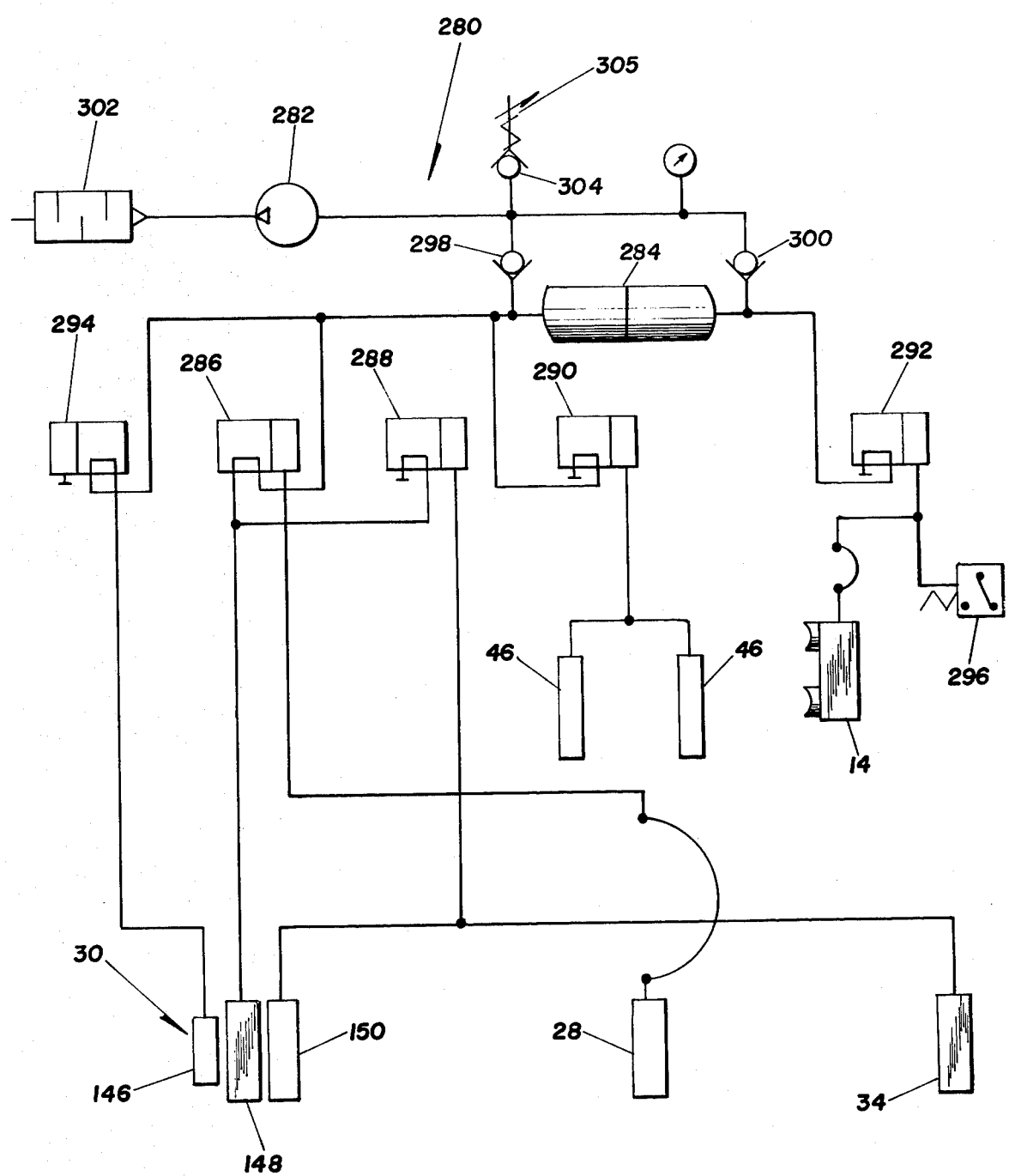
FIGS. 43 through 47 are schematic diagrams illustrating the vacuum system of the laminator.

In FIG. 43, which shows the Status 1 condition of operation of the vacuum system 280 of the laminator 10, it will be seen that with the vacuum valve 286 spool moved to the left, for convenience, designated the number one position, the hold cutoff vacuum bar 148 is activated as is also the film hold vacuum bar 146, the other vacuum bars 28, 150 and 34, the pick-up unit or panel feeder 14 and the left and right tension bars 46, being inactivated. The film feed vacuum bar 28, as shown, is in a position immediately to the right of the laminating rolls 26, as seen in FIG. 37.

Figure 44:
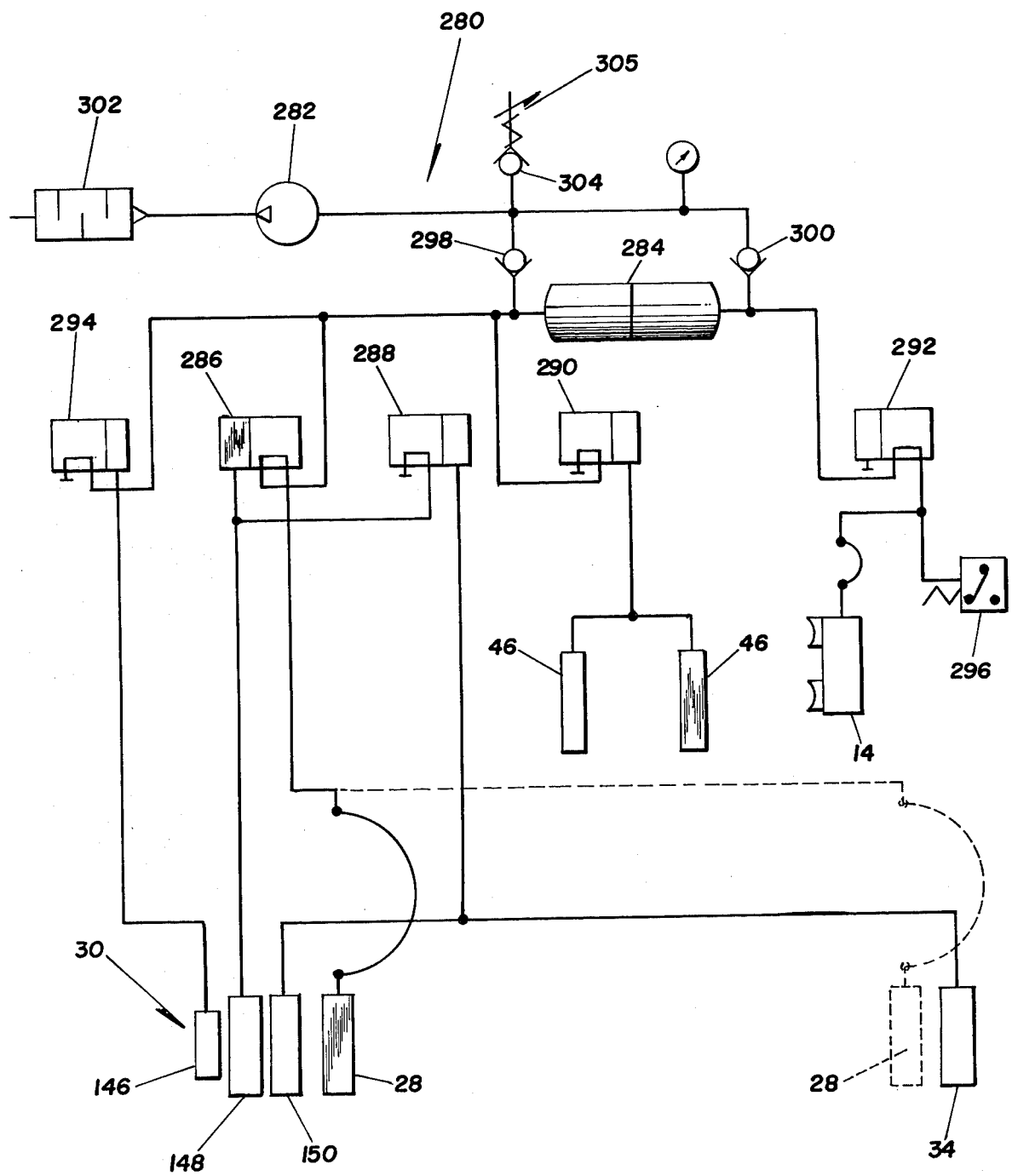

FIG. 44 shows the Status 2 and 3 conditions of operation of the vacuum system 280. In the Status 2 condition, with the spools of the vacuum valves 286 and 292 moved to the right, for convenience, designated the number two position, the hold cutoff vacuum bar 148 and the film hold vacuum bar 146 are deactivated, and the film feed vacuum bar 28 is activated, being in the full line position to the left, as seen and as shown also in FIG. 38. Also activated are the panel feeder 14 and the vacuum switch 296, indicating panel or board pickup. The film feed bar 28 is in film pickup position adjacent the hold cutoff vacuum bar 148. The panel feeder 14 is actuated to pick up a panel 62 from the stack in panel feed unit 16.

In the Status 3 condition, the film feed vacuum bar 28 is in the dotted line position, as seen in FIG. 44, at the extreme position to the right. This is the film drawn position. In this position, the film feed bar 28 is above the right film hold bar 34. The panel 62 is picked up by the panel feeder 14 and is in feed position above the lamination nip 90, as seen in FIGS. 3 and 39.

Figure 45:
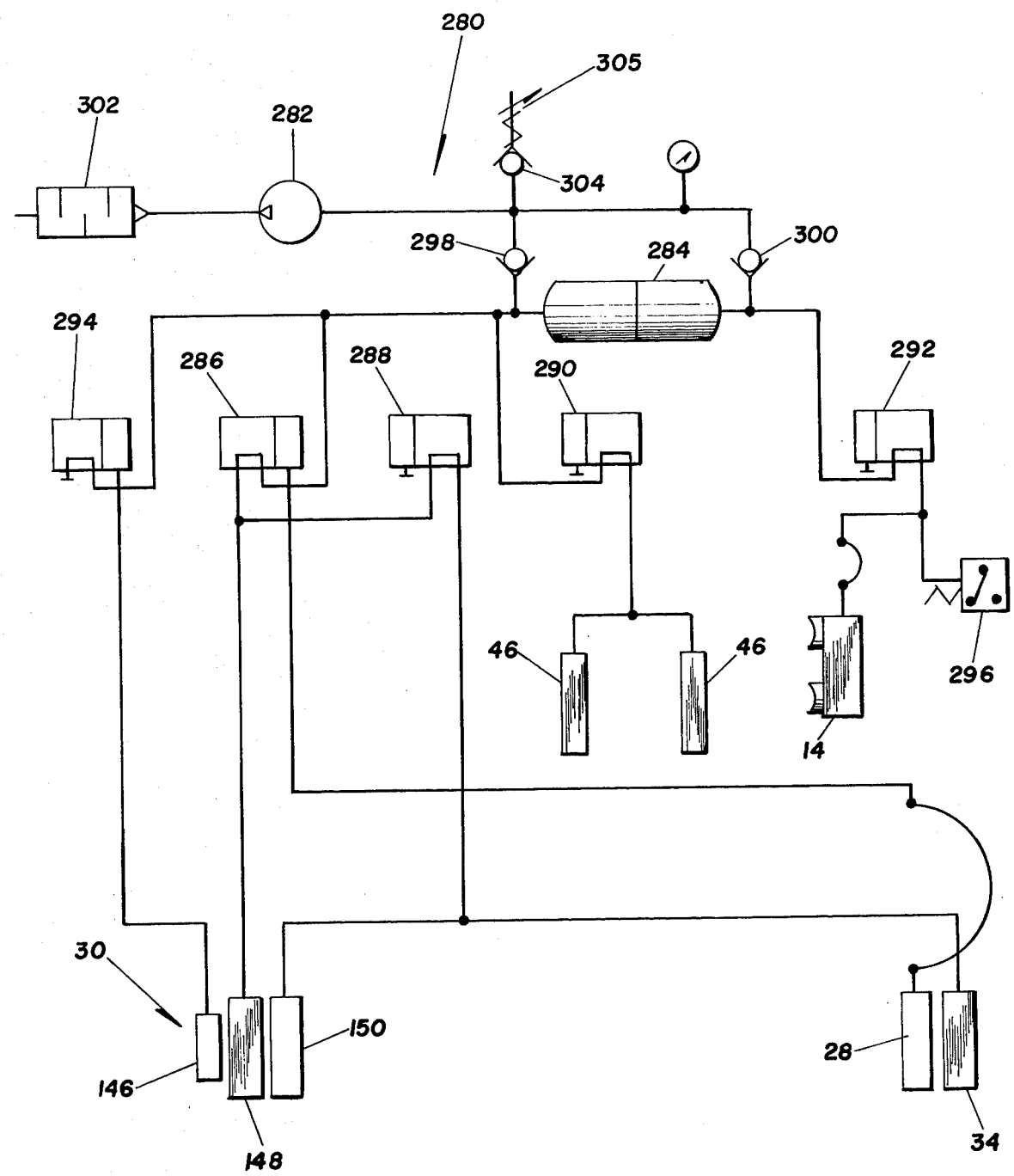

The Status 4 condition of the vacuum system 280 is shown in FIG. 45. Here, with the vacuum valve 286 spool moved to the left or number one position and the spools of vacuum valves 290 and 292 to the right or number two position, the film hold cutoff vacuum bar 148 is activated, the film 52 is transferred from the film feed vacuum bar 28 to the film hold vacuum bars 150 and 34, and the film tension bars 46 are activated, that is tension is placed on the film 52. With the film hold cutoff vacuum bar 150 activated and holding the film 52, the film cutoff knife 24 is activated, as described in connection with FIG. 40, to cut the film 52.

Figure 46:
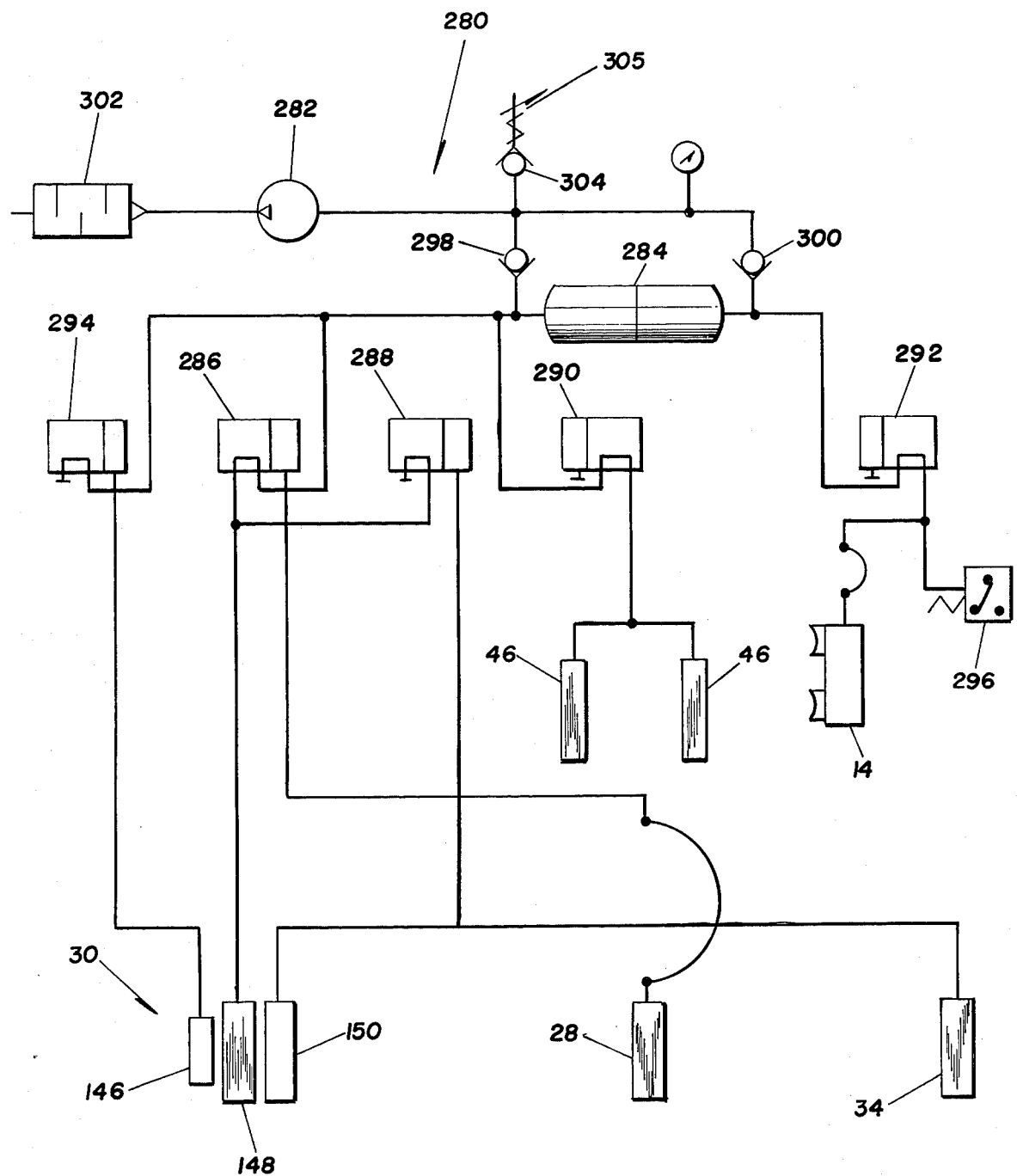

In the Status 5 condition of the vacuum system 280, as seen in FIG. 46, with the tension bars 46 activated and the vacuum switch 296 and the film hold cutoff bar 148 activated and holding the leading edge (from the supply roll 18) of the film, the panel feed cycle starts and the panel feeder member 92 and the arms 80, 82 and 84 carried thereby are moved downwardly causing the bottom edge of the panel 62 that had been picked up to contact the film 52, as seen in FIGS. 4 and 41. Meanwhile, the film feed vacuum bar 28 is moved to the left to a position immediately to the right of and above the laminating rolls 26.

Figure 47:
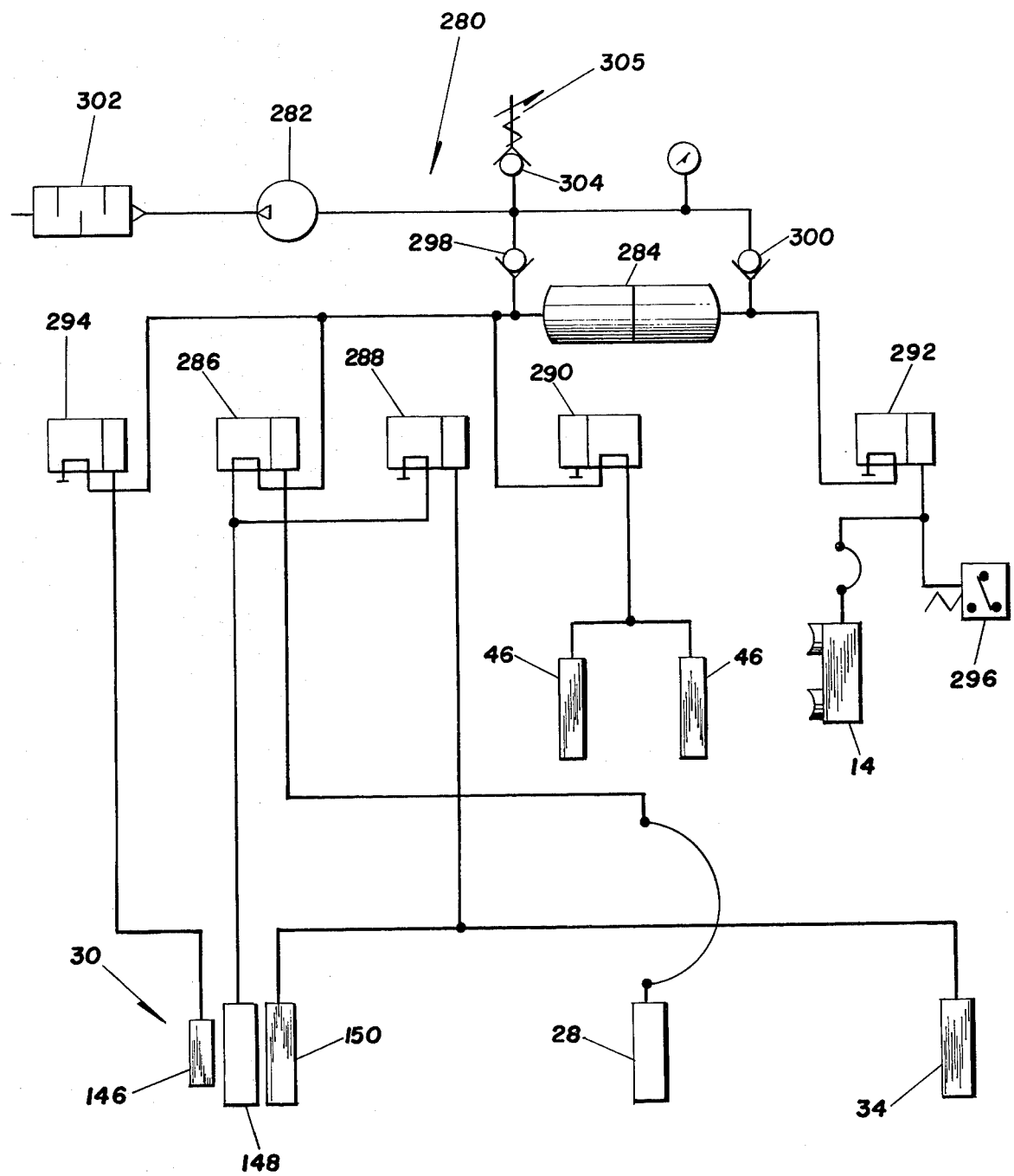

The Status 6 condition of the vacuum system 280 is shown in FIG. 47. Here the panel feeder 14 and the vacuum switch 296 are deactivated, the tension bars 46 continue to be activated, and the film hold cutoff bar 148 continues to be activated with the film feed vacuum bar 28 in the position immediately to the right of the laminating rolls, as in FIG. 37. The feeder vacuum releases and the panel 62 that had been picked up proceeds down through the nip 90 and through the laminating rolls 26 with the film 52 being drawn about the opposite sides thereof and pressed firmly thereagainst by the laminating rolls 26.

For selectively operating the spool of each of the two position vacuum valves 286, 288, 290, 292 and 294 of the vacuum system 280 into its number one or number two position, there is provided a solenoid operated air actuator 306 as schematically illustrated in FIGS. 48 and 49. The actuator 306 includes a slide member 308 that, in a first position, as actuated by a solenoid 310 and as shown in FIG. 49, establishes a path for applying air pressure from a suitable source of air pressure to move the piston 312 of a cylinder actuator 314 to the left. A rod 326 of the cylinder actuator is attached to the spool of an associated vacuum valve, valve 286, for example, and moves the said spool to the left or number one position.

In FIG. 49, the slide member 308 of the actuator 306 is shown as having been actuated by the solenoid 310 to a second position wherein a path for applying air pressure is established to move the piston 312 of the cylinder actuator 314 to the right and thereby to move the spool of the vacuum valve 286 to the right or number two position.

Figure 50:
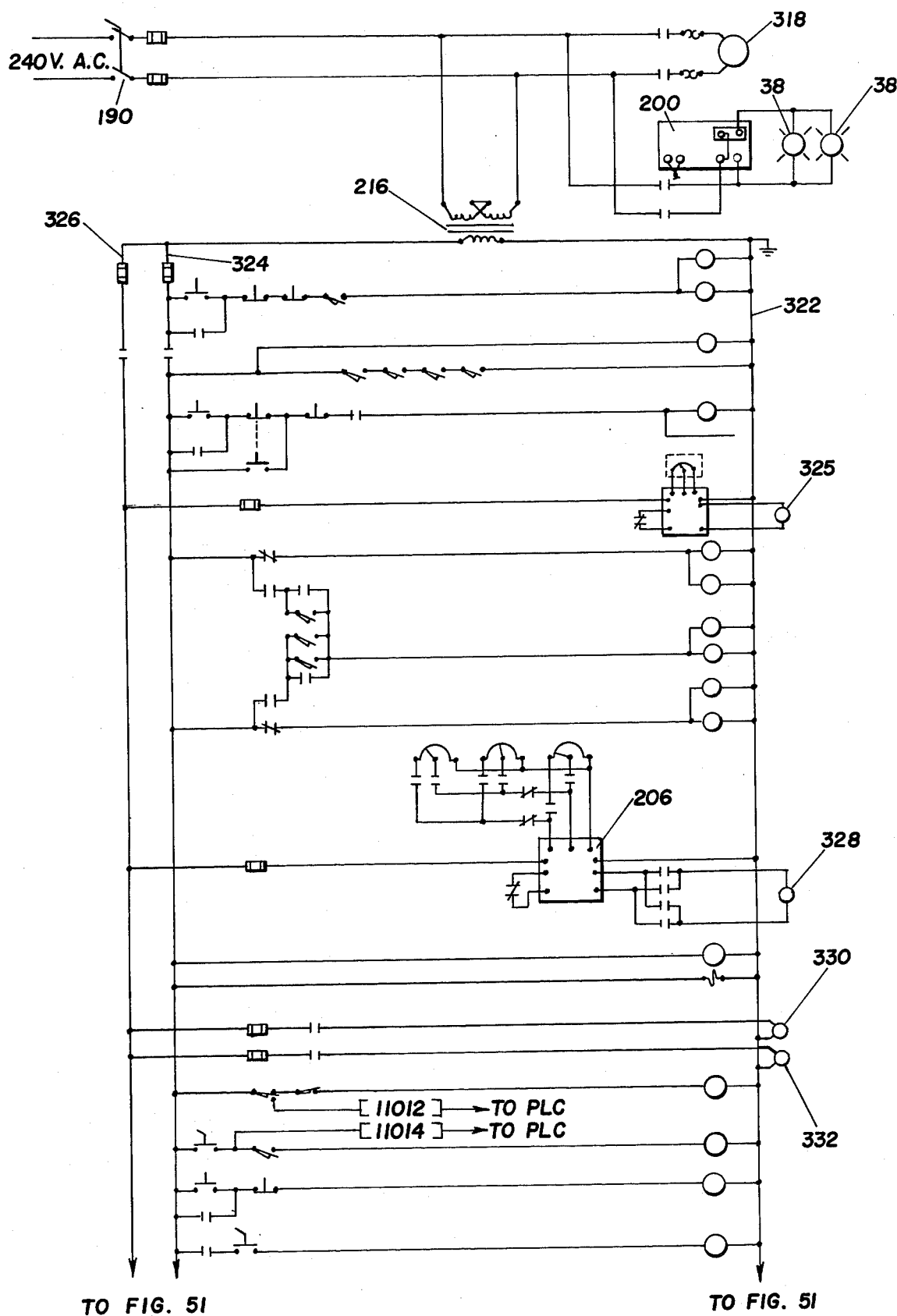
FIGS. 50 and 51 are electrical wiring diagrams showing the hard wired circuitry for the electrical controls and drives for the laminator.
Figure 51:
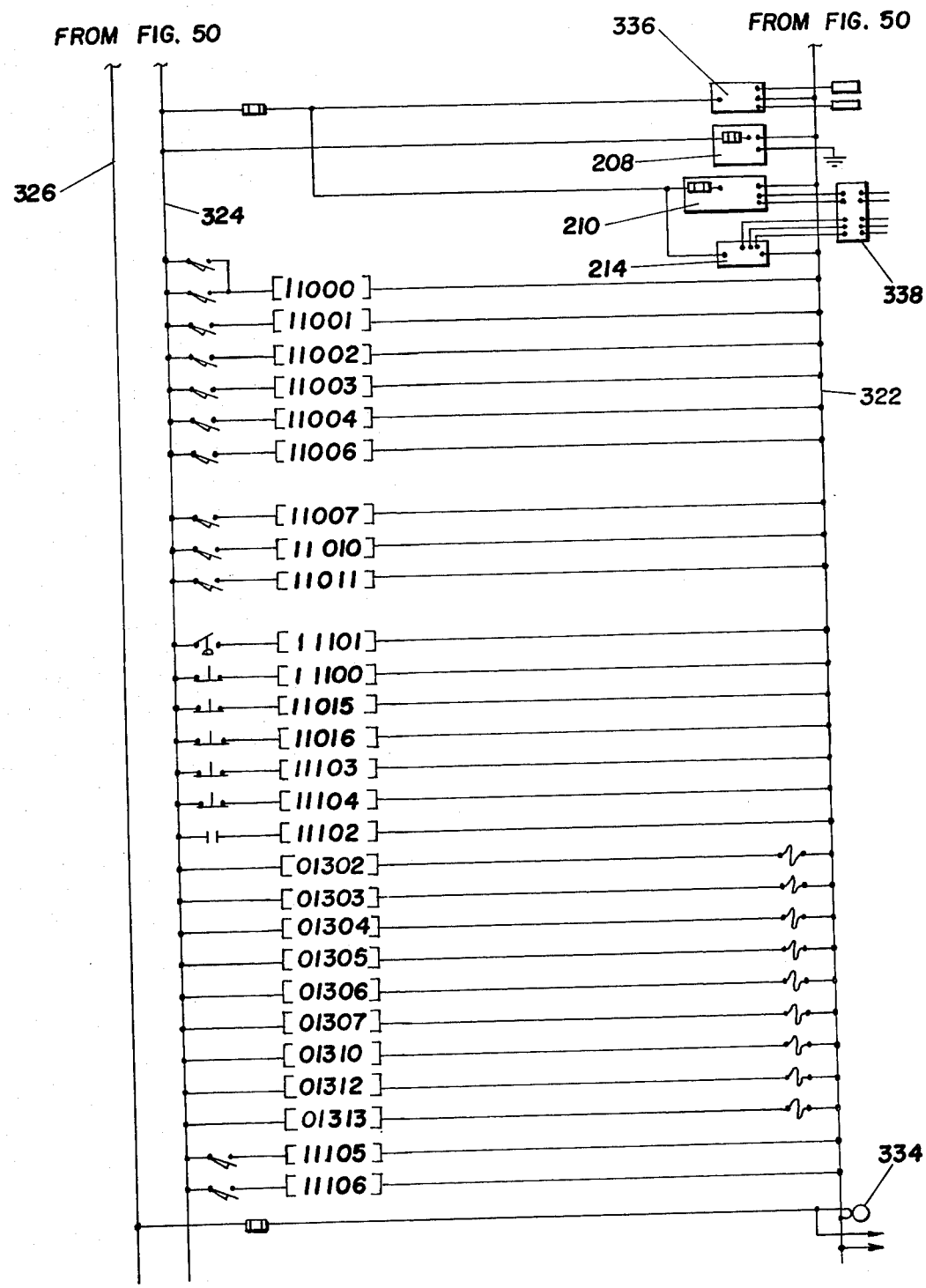

A hard wired across-the-line electrical wiring diagram for the laminator is shown in FIGS. 50 and 51, FIG. 51 comprising a continuation of FIG. 50 at the bottom thereof, as indicated by the notation thereat "To FIG. 51," and by the notation "From FIG. 50" at the top of FIG. 51.

As shown in FIG. 50, power for the electrical circuitry is provided through the main disconnect switch 190 from a 240 volt alternating current source. Directly connected to the switch 190 through suitable fuses is the primary winding of a transformer 216. Also connected to the switch 190 but through a motor starter contacter are a vacuum pump motor 318 and the IR lamps 38, the latter being provided also with the silicon controlled rectifier (SCR) controller 200.

One terminal of the secondary winding of transformer 216 is connected to a grounded line wire 322. The other terminal of the secondary winding is connected to two ungrounded lines indicated at 324 and 326. Connected between the lines 322 and 324 are master control, safety and interlock relays, a lamp to indicate when the power is "ON", relays to control the actuation of the film feed vacuum bar 28, the film unwind drive, and controls for the panel feeder 14, the vacuum pump 282 and the IR lamps 38.

Connected between the lines 322 and 326 are the D.C. Motor Control unit 222 for a main drive direct current motor 326, and the D.C. Motor Control unit 206 for a direct current motor drive 328 for the film feed vacuum bar 28. Also connected between the lines 322 and 326 are a film unwind drive alternating current motor 330 and a feeder pile lift alternating current motor 332. Additionally, as shown in FIG. 51, an Exhaust Blower motor 334 is connected between lines 322 and 326.

As shown in FIG. 51, there is further connected between the lines 322 and 324 a photo pick-up unit 336, a programmable controller (PLC-2) unit 208, the 5-volt direct current power supply unit 210, and the digital thermometer 214, the 5-volt D.C. power supply 210 being employed to energize a Dual Hex Inverter 338.

FIGS. 50 and 51 further show connected between the lines 322 and 324 some thirty-three INPUTS and OUTPUTS of the programmable controller (PLC) 210, a description for which is provided, as follows, with INPUTS being designated by the five digit numbers that begin with a "1" and OUTPUTS being designated by the five digit numbers that begin with a "0".

In the programmable controller (PLC) or microprocessor 208 there are provided timers and counters for performing, in timed sequence, operations of the laminator 10, as follows:

1024 AUTOMATIC LAMINATOR
TIMERS AND COUNTERS

| | |
|---|---|
| 030 (TON) | TIME DELAY FILM PICKUP |
| 031 (TON) | TIME DELAY FILM HOLD |
| 032 (TON) | TIME DELAY FOR FILM DROP |
| 033 (TON) | TIMER, FILM HOLD FOR PICKUP |
| 034 (TON) | AUTO CYCLE, LOGIC RESET |
| 035 (TON) | STACKER, COUNTER START SIGNAL OFF |
| 036 (CTU) | BOARD COUNT |
| 037 (TOF) | MS,1 MAIN GRAPHIC REWRITE |
| 040 (TON) | |
| 042 (CTU) | START LOGIC DELIVERY DRIVE |
| 041 (<) | ROLL TEMP. INTERLOCK |
| 043 (TON) | TURN OFF FOR (TON) 032 |
| 044 (TON) | PULS TIMER TO REWRITE MESSAGE 3 & 4 |
| 044 (TOF) | PULS TIMER TO REWRITE GRAPHIC |
| 046 (TON) | PULS TIMER TO REWRITE GRAPHIC |

The graphic program for the programmable controller 208 is, as follows:

| PLC/OUTPUTS | DESCRIPTION |
|---|---|
| 01300 | Film Feed Bar Extend |
| 01301 | Film Feed Bar Retract |
| 01302 | 1 Sol. Vacuum Valve #286 |
| 01303 | 2 Sol. Vacuum Valve #288 |
| 01304 | 3 Sol. Vacuum Valve #290 |
| 01305 | 4 Sol. Vacuum Valve #292 |
| 01306 | 5 Sol. Vacuum Valve #294 |
| 01307 | 6 Sol. Feeder Pick Up |
| 01310 | 8 Sol. 1st Down Stroke |
| 01311 | Stacker Drive Control |
| 01312 | 9 Sol. 2nd Down Stroke |
| 01313 | 7 Sol. Film Cut Off |
| 01314 | Film Feed Bar Control |
| 01315 | Feeder Pile Lift Inhibit |
| 01316 | Interlock |
| 01317 | |

| PLC/INPUTS | L.S. | DESCRIPTIONS |
|---|---|---|
| 11000 | 1 | Film Feed Bar Position Status #1 |
| 11001 | 2 | Film Feed Bar Position Status #2 |
| 11002 | 3 | Film Feed Bar Position Status #3 |
| 11003 | 4 | Feeder Status #1 Horizontal Position |
| 11004 | 5 | Feeder Status #2 Horizontal Position |
| 11005 | 6 | Feeder Status #1 Vertical Position |
| 11006 | 7 | Feeder Status Mid. Vertical Position |
| 11007 | 8 | Feeder Status #6 Vertical Position |
| 11010 | 9 | Stacker Drive Hold Position |
| 11011 | 10 | Tach |
| 11012 | 11 | Feeder Empty |
| 11013 | | Interlock Main Drive |
| 11014 | | Feeder Pile Life Inhibit |
| 11015 | | Auto On |
| 11016 | | Auto Off |
| 11017 | | |
| 11100 | | Reset |
| 11101 | | Feeder Vacuum Switch |
| 11102 | | Photo Pick Up |
| 11103 | | Feeder Cycle |
| 11104 | | Film Cycle |
| 11105 | | Film Cut Knife Hold Position |
| 11106 | | Film Cut Knife Extended Position |
| 11107 | | Main Drive, 1 CR |

GRAPHIC PROGRAM

| | |
|---|---|
| 02710 | MS, 1 MAIN PROGRAM |
| 02711 | MS, 2 DIGITAL THERMOMETER AND BOARD COUNT |
| 02712 | MS, 4 DRIVE INTERLOCK |
| 02713 | MS, 3 FEEDER EMPTY |
| 02714 | MS,5 AUTO ON |
| 02715 | MS, 6 UNWIND 6 PILE FEED OFF FILM FEED BAR, JOG MODE |

GRAPHIC PROGRAM
MS, 1
MAIN GRAPHIC

MS,1 RETURN
CTRL L CTRL P4G
CTRL P4C CTRL P2T
CTRL P20;2A
ASTRO/CIRCUITS/1024/AUTO/LAMINATOR/UNIT/#1/
CTRL P36;5A
CTRL P 5G CTRL POT
F SHIFT K SHIFT K K
CTRL P 36;6A
F SHIFT K SHIFT K K T F
CTRL P 36;7A
F SHIFT K SHIFT K K SPACE F
CTRL P 36;8A
F SHIFT K SHIFT K K T F
CTRL P 36;9A
F SHIFT K SHIFT K K
CTRL P 36;10A
SHIFT L SHIFT L SHIFT L SPACE SPACE II
CTRL P 19;11A
ZZ SPACE SHIFT L SPACE SHIFT L SPACE SHIFT L SSL SSL
(19 TIMES)
SPACE ZZ
CTRL P38;12A
RT RT SPACE
CTRL P4G
CTRL P2T ROLL SPACE TEMP.,
CTRL P5G
CTRL POT
CTRL P40;14A SHIFT K SPACE SPACE SPACE SPACE SS
CTRL P40;15A SHIFT K SPACE SPACE SPACE SS
CTRL P40;16A SHIFT K SPACE SPACE SS
CTRL P40;17A SHIFT K SPACE SS
CTRL P40;18A SHIFT K SS SPACE CTRL P4G
CTRL P2T BOARD SPACE COUNT..
CTRL P5G
CTRL POT
CTRL P40;19A SHIFT L SHIFT L SHIFT L
ESC

GRAPHIC PROGRAM
MS,2
DIGITAL THERMOMETER
AND BOARD COUNT

MS,2 RETURN
CTRL P4C
CTRL P2T
CTRL P55;12A
*112*
CTRL P59;18A
*036*

GRAPHIC PROGRAM
MS,3
DRIVE INTERLOCK

MS,3 RETURN
CTRL P4G
CTRL L
CTRL P30;12A
CTRL P2;3;4T
INTERLOCK
ESC

GRAPHIC PROGRAM
MS,4
FEEDER EMPTY

MS,4 RETURN
CTRL P4G
CTRL P42;7A
CTRL P2;3T
EMPTY
CTRL POT
ESC

GRAPHIC PROGRAM
MS,5
AUTO ON

MS,5 RETURN
CTRL P4G
CTRL P43;7A
CTRL P2;4T
SPACE
AUTO ON
SPACE
ESC

GRAPHIC PROGRAM
MS,6
UNWIND AND PILE FEED OFF
FILM FEED BAR JOG MODE

MS,6 RETURN
CTRL P4G
CTRL P10;6A
CTRL P2;4T
UNWIND & PILE FEED OFF
CTRL P10;7A
FILM FEED BAR JOG MODE
ESC

A ladder diagram of the soft program for the automatic laminator 10 is, as follows:

```
MFS>p

LADDER DIAGRAM DUMP 004
                                                            START
  ! 110    020    020    111                                        020
  +-] [-+-]/[----]/[---]/[-----------------------------------------( )--
  !  15!   12     10     00                                          00
  ! 020 !
  +-] [-+
  !  00
  ! 110    110                                                       013
  +-] [----]/[-+---------------------------------------------------( )--
  !  13     12!                                                      16
  ! 013    110 !
  +-] [----] [-+
  !  16     13
  ! 112    041                                                       020
  +-[G]----[<]-----------------------------------------------------( )--
  ! 075    070                                                       12
  ! 111    020    110                                                020
  +-] [----]/[-+-] [-----------------------------------------------( )--
  !  04     00!   13                                                 01
  ! 020    020 !
  +-] [----] [-+
  !  01     02
  ! 111    020    020    110    110                                  031
  +-] [----]/[-+-]/[----] [----]/[-------------------------------(TON)-
  !  04     00!   02     13     01                                   .01
  ! 031        !                                                     PR 100
  +-] [--------+                                                     AC 000
  !  17
  ! 031           020    110                                         013
  +-] [-----------+-]/[----] [---------------------------------------( )--
  !  15        !   02     13                                          13
  ! 013    111 !
  +-] [----]/[-+
  !  13     06!
```

```
! 032       !
+-] [-------+
!   15
! 111   111   111                                                020  !
+-] [---]/[-+-]/[-------------------------------------------------( )--+
!   06    05!  00                                                 02
! 110       !
+-]/[-------+
!   14      !
! 020   110 !
+-] [---]/[-+
!   02    01
! 111   020   110   013   110   110                              013  !
+-] [---] [---] [-+-]/[---]/[---] [-------------------------------( )--+
!   04    02    05!  00    01    13                               01  !
!
! 013   110   110 !
+-] [---]/[---] [-+
!   01    00    14!
! 110   020   110 !
+-] [---] [---]/[-+
!   07    02    00!
! 110   020   110 !
+-] [---] [---]/[-+
!   07    02    00!
! 034       !
+-] [-------+
!   17
! 040                                                             013  !
+-] [-------------------------------------------------------------( )--+
!   15                                                             14  !
! 013                                                             040  !
+-] [-+-----------------------------------------------------------(TON)-+
!   01!                                                            0.1 !
! 013 !                                                           PR 002!
+-] [-+                                                           AC 000!
!   00
! 110                                                             030  !
+-] [-------+-----------------------------------------------------(TON)-+
!   01      !                                                      .01 !
! 030   110 !                                                    PR 075 !
+-] [---]/[-+                                                    AC 000 !
!   17    02
! 110                                                             013  !
+-] [-------+-----------------------------------------------------( )--+
!   01      !                                                     02  !
! 013   110 !
+-] [---]/[-+
!   02    02
! 031                                                             013  !
+-] [-+-----------------------------------------------------------( )--+
!   17!                                                            03  !
! 032 !
+-] [-+
!   17
! 020   030   013   110   110                                    013  !
+-]/[---] [---]/[---] [-+-] [-------------------------------------( )--+
!   00    15    13    05!  13                                     00  !
! 020   030   013       !
+-] [---] [---]/[-------+
!   00    15    13
! 110                                                             043  !
+-] [-------------------------------------------------------------(TON)-+
```

```
!   02                                                                    0.1  !
!                                                                      FR 030  !
!                                                                      AC 000  !
! 110    043                                                              032  !
+-] [---]/[-------------------------------------------------------------(TON)-+
!  02    15                                                               .01  !
!                                                                      FR 100  !
!                                                                      AC 000  !
! 032                                                                     013  !
+-] [---------------+                                                  ---( )-+
!  17               !                                                      04  !
! 013    131    111 !
+-] [---]/[---]/[-+ !
!  04    00    02 ! !
! 020    111              110                                             013  !
+-]/[---] [--------------+-] [----------------------------------------- ---( )-+
!  00    03              !  05                                             07  !
! 013    111    111      !
+-] [---]/[---]/[--------+
!  07    01    00        !
! 013    111    020    020 !
+-] [---]/[---]/[---] [-+
!  01    01    07    00 !
! 110    110    110                                                       013  !
+-] [---] [---] [-------------------------------------------------------( )--+
!  03    14    13                                                          15  !
! 110                                                                     013  !
+-] [---------------+                                                  ---( )-+
!  04               !                                                      05  !
! 013    111    110 !
+-] [---]/[---]/[-+ !
!  05    00    07 ! !
! 013    020              111    110                                      013  !
+-] [---]/[--------------+-]/[---] [----------------------------------- ---( )-+
!  05    00              !  00    03                                       10  !
! 013    111             !
+-] [---]/[--------------+
!  10    02              !
! 020    110    013      !
+-] [---] [---] [-+
!  00    00    00 !
! 020    020    013             111    110                                013  !
+-] [---]/[---] [--------------+-]/[---] [-----------------------------(  )--+
!  13    00    10              !  00    03                                 12  !
! 020    013    013            !
+-] [---] [---] [--------------+
!  00    10    12              !
! 020    020    020    020 !
+-] [---] [---] [---] [-+
!  13    00    06    05 !
! 110                                                                     020  !
+-]/[-+----------------------------------------------------------------( )--+
!  10 !                                                                    13  !
! 013 !
+-] [-+
!  12 !
! 110    033                                                              013  !
+-] [---]/[-+                                                          ---( )-+
!  01    15 !                                                              06  !
! 013    110!
+-] [---]/[-+
```

```
!  06    02
! 110                                                                    033  !
+-] [-------------------------------------------------------------------(TON)-+
!  01                                                                    .01
!                                                                      PR 050 !
!                                                                      AC 000 !
!
! 042   035   110   111                                                  013  !
+-] [---]/[-+-] [---] [--------------------------------------------------( )--+
!  15    15!  13    07                                                    11  !
! 110        !
+-] [--------+
!  10
! 042                                                                    035  !
+-] [--------+----------------------------------------------------------(TON)-+
!  15        !                                                            0.1
! 035   035  !                                                         PR 020 !
+-]/[---] [--+                                                         AC 020 !
!  15    17
! 110   013                                                              020  !
+-] [---] [--+----------------------------------------------------------( )--+
!  11    12!                                                              11  !
! 020   013 !
+-] [---]/[-+
!  11    11
! 110   020                                                              042  !
+-] [---] [-+----------------------------------------------------------(CTU)-+
!  11    11!
!                                                                      PR 005 !
!                                                                      AC 012 !
!
! 013   110   110                                                        042  !
+-] [---] [---]/[-------------------------------------------------------(CTR)-+
!  10    03   07
!                                                                      PR 005 !
!                                                                      AC 012 !
!
! 111   110                                                              020  !
+-] [---] [--+----------------------------------------------------------( )--+
!  01    04!                                                              03  !
! 020   111 !
+-] [---] [-+
!  03    02
! 110   020   020   034                                                  020  !
+-] [-+-] [---] [---]/[-------------------------------------------------( )--+
!  02!  00    02    17                                                    04  !
! 020  !
+-] [--+
!  04

! 110   020   111   020   034                                            020  !
+-] [---] [---] [-+-] [---]/[-------------------------------------------( )--+
!  02    04    06!  00    17                                              05  !
! 020             !
+-] [-------------+
!  05
! 110   111   020                                                        020  !
+-] [---] [-+-] [------------------------------------------------------( )--+
!  03    01!  00                                                          06  !
! 020   111 !
+-] [---]/[-+
```

```
!   06    02!
!  020   111 !                                                              
+-] [---]_[-+                                                               
!   06    01                                                                
!  020   111   020   034                                                  020 !
+-] [---]/[-+-] [---]/[------------------------------------------------( )--+
!   06    02!  00    17                                                   07 !
!  020      !
+-] [-------+
!   07
!  020   020   110   020   110                                            034 !
+-]/[---] [---]/[---]/[---] [-+--------------------------------------(TON)-+
!   06    07    12    14    05!                                           .01 !
!  034   034                  !                                         PR 500 !
+-] [---]/[-------------------+                                         AC 000 !
!   17    15
!  020   020   110                                                        020 !
+-]/[---] [---] [-+------------------------------------------------------( )--+
!   06    07    12!                                                        10 !
!  110            !
+-]/[-------------+
!   14
!  020   020   020 !
+-]/[---] [---] [-+
!   06    07    14
!  110   110                                                              020 !
+-] [-+-]/[------------------------------------------------------------( )--+
!   16!   15
!  020 !
+-] [-+
!   14
!  111                                                                    036 !
+-] [-----------------------------------------------------------------(CTU)-+
!   02                                                                        
                                                                        PR 000 !
                                                                        AC 192 !
!  110   111                                                              036 !
+-] [---] [-----------------------------------------------------------(CTR)-+
!   16    00
                                                                        PR 000 !
                                                                        AC 192 !

!  110   110   020                                                        037 !
+-]/[---]/[---]/[-----------------------------------------------------(TOF)-+
!   12    13    00                                                        0.1 !
                                                                        PR 009 !
                                                                        AC 009 !

!  110   110   020   020   020                                            027 !
+-]/[---] [---]/[---]/[---]/[-------------------------------------------( )--+
!   12    13    17    00    16                                             10 !
!  110   110   110   020                                                  027 !
+-] [---] [---]/[---]/[-------------------------------------------------( )--+
!   11    13    12    16                                                   11 !
!  027   110                                                              044 !
+-] [---]/[-+--------------------------------------------------------(TON)-+
!   13    13!                                                             0.1 !
!  027   110 !                                                          PR 009 !
+-] [---]/[-+                                                           AC 009 !
!   15    13!
!  044   044 !
+-] [---]/[-+
!   17    15
```

```
!  110    044                                                                          027   !
+-] [---] [-+-----------------------------------------------------------------(   )--+
!   12     15!                                                                          13  !
!  110    044  !                                                                             !
+-] [---]/[-+                                                                                !
!   12     17                                                                                !
!  110    044    020                                                                    027   !
+-]/[---] [-+-]/[-------------------------------------------------------------(   )--+
!   13     15!   16                                                                      12  !
!. 110    044  !                                                                             !
+-]/[---]/[-+                                                                                !
!   13     17                                                                                !
!  020                                                                                  027   !
+-] [--------------------------------------------------------------------------(   )--+
!   00                                                                                   14  !
!  110    044    020    110                                                             027   !
+-]/[---] [-+-]/[---] [--------------------------------------------------------(   )--+
!   14     15!   17     13                                                               15  !
!  110    044  !                                                                             !
+-]/[---]/[-+                                                                                !
!   14     17                                                                                !
!  037    037                                                                           020  !
+-]/[---] [----------------------------------------------------------------------(   )--+
!   17     15                                                                            17 !
!  110                                                                                  045  !
+-]/[-------------------------------------------------------------------------(TOF)--+
!   14                                                                                   0.1 !
!                                                                                        PR 009 !
!                                                                                        AC 009 !
!                                                                                             !
!  110                                                                                  046  !
+-] [-------------------------------------------------------------------------(TON)--+
!   14                                                                                   0.1 !
!                                                                                        PR 005 !
!                                                                                        AC 005 !
!                                                                                             !
!  045    045                                                                           020  !
+-] [---]/[-+---------------------------------------------------------------------(   )--+
!   15     17!                                                                           16  !
!  046    046  !                                                                             !
+-] [---]/[-+                                                                                !
!   17     15
```

END 00526

Thus, in accordance with the invention, there has been provided an apparatus for automatically laminating photoresist dry film onto each of a succession of printed circuit boards or panels, the film being drawn into a laminating station and pre-cut precisely to the length required for each panel, and a polyethylene protective cover for the film being wound on a take-up roll. Each panel is picked up, in turn, from a stack of panels located above the film transversely thereof, and is moved downwardly to engage the film along a transverse center line and to move the film through a lamination nip and through heated laminating rolls whereby the film is laminated to both sides of the panel with no overlap, eliminating the need for trimming. The temperature of the heated rolls is accurately controlled and monitored by a programmable controller or microprocessor responsively to the surface temperature of the laminating rolls. The microprocessor also controls and directs the sequential operation of the various laminator components. A full set of ladder diagrams of both the hard wired and soft program for the microprocessor are disclosed together with a complete list of inputs, memory outputs, timers and counters that are used to reference the microprocessor to the hard wired circuit.

The invention features stacking of the panels with a slant 10° counterclockwise from the vertical so that the panels will stay in place until picked up by the pick-up means with the dry film disposed at a corresponding upward slant so that the panels engage the film at substantially a 90° angle when moved down into engagement with the film.

The invention further features control of the film to panel position during such downward panel movement, and also ready adjustment in the length of the laminating station for accommodating panels of different size.

Additional features of the automatic laminators according to the present invention are fully automatic feed, laminate and stack, a unique arrangement of externally heated laminating rolls with IR lamps and a solid state temperature controller, a CRT display for diagnostic analysis and operating conditions, safety interlocked and emergency shut off, a fully enclosed laminator with incoming air internally filtered, easy thread-up/rapid change-over, and operation with a single roll of photoresist dry film (up to 1000 linear feet and cycling 100 (0.0062" thick) panels per load in an operative embodiment of the invention.

What is claimed is:

1. A laminator for applying photoresist dry film to the opposite faces of panels comprising, supporting frame means providing a laminating station and a nip located substantially centrally with respect to said station, means for releasably suspending each of successive predetermined lengths of photoresist dry film in said laminating station above said nip with said nip substantially midway the length of each of said lengths of film, means for providing a supporting surface for holding a stack of panels in an upright position, said supporting surface being slanted slightly from the vertical direction so that the panels are stably supported and tend to stay in place, pick-up means for picking up and holding successive ones of the panels in upright position in line with said nip as each of the successive lengths of film are suspended above said nip, and means associated with said pick-up means for moving each of the successive panels down into engagement with the film and into said nip, the direction of suspension of each of the successive lengths of film being slightly from the horizontal direction corresponding to the slant of said supporting surface whereby each panel engages the associated length of film at a substantially 90° angle during the downward movement thereof.

2. A laminator as specified in claim 1 wherein the slant from the vertical of said supporting surface and the slant from the horizontal of the direction of suspension of the film are each about 10°.

3. A laminator as specified in claim 1 wherein said pick-up means includes a plurality of pick-up bars each of which has activatable cups thereon and is positioned transversely of the panels, said pick-up bars having an operative pick up position and a retracted position, said vacuum cups being operative when activated with said pick-up bars in said operative position to pick up and hold a panel, and further including a panel attachment having an undulating surface thereon that faces each panel as it is picked up for imparting a stiffening effect to each such panel.

4. A laminator as specified in claim 1 further including a pair of cooperating heated laminating rolls below said laminating nip, and delivery stacking means, wherein said means for moving each of the successive panels moves each of the panels, in turn, through said nip and between said rolls with said film being folded against the opposite sides of the panel.

5. A laminator as specified in claim 4 further including infra red lamps intensified to heat the surface of each of said laminating rolls.

6. A laminator as specified in claim 5 further including temperature responsive means positioned to sense the temperature of the surface of at least one of said laminating rolls, and means controlled by said temperature responsive means to control the energization of said infra red lamps for maintaining the temperature of the surface of said laminating rolls substantially constant.

7. A laminator as specified in claim 6 wherein said temperature responsive means is a thermocouple and said means controlled by said temperature responsive means is a solid state electrical controller.

8. A laminator as specified in claim 4 wherein said means for moving each of the successive panels includes first delivery belt means and associated delivery belt lug means for lowering each of the panels down into said delivery stacking means.

9. A laminator as specified in claim 4 wherein said laminating rolls are supported on parallel shafts positioned in a plane parallel to the direction of suspension of the successive lengths of film, one of said shafts having at each end a concentric end portion and an eccentric end portion, and including shaft rotation means to rotate said one shaft about its longitudinal axis, a double cut bearing provided at each end of said one shaft for supporting said one shaft, each double cut bearing having a first opening and a second opening, said openings being disposed at right angles to each other with said concentric shaft end portion supported in said first opening and said eccentric shaft end portion supported in said second opening, whereby rotation by said shaft rotation means of said one shaft causes relative movement of said one shaft with respect to said other shaft thereby, selectively, to increase the pressure applied by said laminating rolls to said panels and said film being laminated thereto, or to relax such pressure, said movement being linear and parallel to the direction of suspension of the successive lengths of film.

10. A laminator as specified in claim 4 wherein said means for releasably suspending each of successive lengths of photoresist dry film in said laminating station includes means for pulling the film from a source of the film into said laminating station, and means positioned at one end of said laminating station for cutting the film to the length required for each of the panels to be laminated.

11. A laminator as specified in claim 10 wherein said means for releasably suspending each of successive lengths of photoresist dry film in said laminating station includes means for applying tension to the film while it is being cut.

12. A laminator as specified in claim 11 wherein said means for applying tension to the film comprises spaced tension bars positioned beneath the film and extending transversely thereof, and further including chain means having a central link,
first spring means,
second spring means, and
fork means, said tension bars being connected by said chain means with each tension bar normally held in an extended position, said first spring means biasing one of said tension bars toward one end of said laminating station and said second spring means biasing the other of said tension bars toward the other end of said laminating station, said fork means being connected to the means associated with the pick-up means and operative to engage the central link of said chain means as each of successive panels are moved down into engagement with the film and into said nip whereby said tension bars are moved toward each other and into engagement with the film for applying tension to the film.

13. A laminator as specified in claim 11 wherein said laminating station has a first end and a second end and said means for pulling the film into said laminating station includes a film feed vacuum bar disposed transversely of the film, said bar having vacuum cavities and being movable in one direction from an intermediate position in said laminating station to said first end thereof where said vacuum cavities pick up the film at the leading end thereof, said bar being movable in the opposite direction through the laminating station to pull the leading end of the film to said second end of the laminating station.

14. A laminator as specified in claim 10 including first, second, third and fourth vacuum bars that are positioned transversely of and beneath said film, said first, second and third vacuum bars being positioned at said one end of said laminating station and said fourth vacuum bar being positioned at the other end thereof, and wherein said means for pulling the film into said laminating station comprises a fifth vacuum bar positioned transversely of and above the film,
all of said vacuum bars including vacuum cavities that are operative when activated to hold the film.

15. A laminator as specified in claim 14 wherein said first, second and third vacuum bars are formed in the same member, and further including first adjustment means and second adjustment means for adjusting the positions of said member and of said fourth vacuum bar, respectively, with respect to said nip.

16. A laminator as specified in claim 14 wherein said supporting frame means includes a first sheet of plastic positioned between said first end of said laminating station and said nip and a second sheet of plastic positioned between said second end of said laminating station and said nip, said first and second sheets of plastic being disposed beneath and in sliding contact with the film as the film is pulled through the laminating station.

17. A laminator as specified in claim 14 wherein said pick-up means for picking up and holding successive ones of the panels includes a plurality of pick-up bars each of which has vacuum cups thereon and is positioned transversely of the panels, said pick-up bars having an operative pick up position and a retracted position, said vacuum cups thereof being operative to hold a panel when activated, further including vacuum producing means,
a plurality of vacuum valves,
first tube means connecting the vacuum cavities of each of said vacuum bars to said vacuum producing means, and including a vacuum valve therein individual to said vacuum cavities of each of said vacuum bars for the selective actuation thereof,
second tube means connecting said vacuum cups of said pick-up bars to said vacuum producing means and including a vacuum valve therein for the selective actuation thereof,
and means to selectively actuate said vacuum valves.

18. A laminator as specified in claim 17 further including check valve means, said check valve means being connected between said first and second tube means for preventing loss of vacuum in one of said first and second tube means from causing loss of vacuum in the other of said tube means.

19. A laminator as specified in claim 13 further including, located at said first end of said laminating station, a film hold cut off bar having a cutting edge and a film hold vacuum bar, and wherein said pick up means for picking up and holding successive one of the panels includes at least one bar having vacuum cups and is disposed transversely of the panels, said vacuum cups having an operative pick-up position and a retracted position, wherein said means for cutting the film is a cutoff knife that is movable transversely of the film, said cutoff knife having an active and an inactive position, wherein said means for applying tension to the film comprises a plurality of tension bars in said laminating station with at least one tension bar adjacent to and on each side of said pair of laminating rolls, each of said tension bars having an inactive position and an active position, and wherein in a first status condition of said laminator, said film feed vacuum bar is in said intermediate position in said laminating section, said vacuum cups of said pick-up means are in a position retracted from the panels, said film cutoff means is in said inactive position, and said tension bars are each in said inactive position,
wherein, in a second status condition of said laminator, said film feed vacuum bar has been moved to the first end of said laminating station to pick up the leading end of the film, the vacuum cups of the pick-up means have been thrust into contact with the facing surface of the adjacent panel, said tension bars each remaining in said inactive position,
wherein, in a third status condition of said laminator, said film feed vacuum bar has been moved in the reverse direction pulling the film along with it through the laminating station to the second end thereof, said pick-up means has picked up a panel and moved it over said lamination nip, and said tension bars have been moved into said active position for applying tension to the film,
wherein, in a fourth status condition of said lamintor, said film cutoff knife is moved into cutting engagement with the film, being pulled transversely of the film along said cutting edge of the film hold cutoff bar thereby severing the film, said tension bars being retained in said active positions during such cutting action,
wherein, in a fifth status condition of said laminator, said film pick-up means is actuated downwardly to move the lower end of the panel into engagement with the upper surface of the film, said cutoff knife has been moved to the inactive position thereof, and the film feed vacuum bar has released the end of the film and has been moved to said intermediate position in said laminating station and
wherein, in a sixth status condition of said laminator, said panel pick-up means is activated downwardly to move the lower end of the panel into and through said lamination nip and pull the film downwardly through said lamination rolls thereby wrapping the film into engagement with the opposite sides of the panel and delivering the laminated panel to said delivery stacking means, said pick-up means then being returned to its upper position to restore said laminator to the first status condition.

20. A laminator as specified in claim 19 and further including a soft program for use in a programmable controller for automatically sequencing said laminator through said status conditions.

* * * * *

UNITED STATES PATENT AND TRADEMARK OFFICE
CERTIFICATE OF CORRECTION

PATENT NO. : 4,464,221
DATED : Aug. 7, 1984
INVENTOR(S) : John L. Garber

It is certified that error appears in the above-identified patent and that said Letters Patent is hereby corrected as shown below:

Column 12, line 16, change "heat" to --heater--.

Column 12, line 39, change "SR" to --IR--.

Column 31, Claim 3, line 3, change "activatable" to -vacuum-.

Column 34, Claim 19, line 44, delete "film".

Signed and Sealed this

Twenty-seventh Day of August, 1991

Attest:

HARRY F. MANBECK, JR.

Attesting Officer

Commissioner of Patents and Trademarks